(12) United States Patent
Tsuchiko et al.

(10) Patent No.: US 9,793,153 B2
(45) Date of Patent: Oct. 17, 2017

(54) LOW COST AND MASK REDUCTION METHOD FOR HIGH VOLTAGE DEVICES

(71) Applicant: Alpha and Omega Semiconductor Incorporated, Sunnyvale, CA (US)

(72) Inventors: Hideaki Tsuchiko, San Jose, CA (US); Sik Lui, Sunnyvale, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/633,785

(22) Filed: Feb. 27, 2015

(65) Prior Publication Data
US 2016/0254347 A1 Sep. 1, 2016
US 2017/0133458 A9 May 11, 2017

Related U.S. Application Data

(63) Continuation-in-part of application No. 13/237,842, filed on Sep. 20, 2011, now Pat. No. 9,214,457.

(51) Int. Cl.
| | |
|---|---|
| *H01L 21/761* | (2006.01) |
| *H01L 29/06* | (2006.01) |
| *H01L 21/266* | (2006.01) |
| *H01L 29/732* | (2006.01) |
| *H01L 29/808* | (2006.01) |
| *H01L 29/78* | (2006.01) |
| *H01L 21/8238* | (2006.01) |
| *H01L 29/423* | (2006.01) |
| *H01L 21/265* | (2006.01) |

(52) U.S. Cl.
CPC .......... *H01L 21/761* (2013.01); *H01L 21/266* (2013.01); *H01L 29/0619* (2013.01); *H01L 29/0646* (2013.01)

(58) Field of Classification Search
None
See application file for complete search history.

(56) References Cited

U.S. PATENT DOCUMENTS 4,047,217 A * 9/1977 McCaffrey .......... H01L 27/0825
257/553
4,529,456 A * 7/1985 Anzai ................... H01L 21/225
257/378
(Continued)

OTHER PUBLICATIONS

Mallikarjunaswamy, S., "LDMOS—Technology and Applications", downloaded from URL < http://www.ewh.ieee.org/r6/scv/eds/slides/2010-Sept-Shekar-LDMOS.pdf> on Feb. 1, 2016.*
(Continued)

*Primary Examiner* — Joseph Schoenholtz
(74) *Attorney, Agent, or Firm* — Joshua D. Isenberg; JDI Patent

(57) ABSTRACT

Aspects of the present disclosure provides a device comprising a P-type semiconductor substrate, an N-type tub above the semiconductor substrate, a P-type region provided in the N-type tub isolated by one or more P-type isolation structures, and an N-type punch-through stopper provided under the P-type regions isolated by the isolation structure(s). The punch-through stopper is heavily doped compared to the N-type tub. The P-type region has a width between the two isolation structures that is equal to or less than that of the N-type punch-through stopper.

11 Claims, 25 Drawing Sheets

(56) References Cited

U.S. PATENT DOCUMENTS

| | | | | |
|---|---|---|---|---|
| 4,628,341 | A * | 12/1986 | Thomas | H01L 21/761 148/DIG. 85 |
| 5,001,073 | A * | 3/1991 | Huie | H01L 21/761 148/DIG. 9 |
| 5,017,996 | A * | 5/1991 | Yasuoka | H01L 27/0623 257/370 |
| 5,470,766 | A * | 11/1995 | Lien | H01L 21/74 257/E21.537 |
| 5,670,393 | A * | 9/1997 | Kapoor | H01L 27/085 148/DIG. 35 |
| 5,899,714 | A * | 5/1999 | Farrenkopf | H01L 21/761 148/DIG. 85 |
| 6,853,040 | B2 * | 2/2005 | Jang | H01L 21/8238 257/335 |
| 7,019,377 | B2 | 3/2006 | Tsuchiko | |
| 7,636,006 | B2 * | 12/2009 | Heurtier | H01L 29/0692 326/62 |
| 7,759,759 | B2 | 7/2010 | Tsuchiko | |
| 8,097,905 | B2 | 1/2012 | Tsuchiko | |
| 8,508,960 | B2 | 8/2013 | Chen et al. | |
| 8,592,274 | B2 | 11/2013 | Tsuchiko | |
| 8,722,477 | B2 | 5/2014 | Tsuchiko | |
| 8,928,127 | B2 * | 1/2015 | Chen | H01L 23/585 257/659 |
| 8,987,821 | B2 | 3/2015 | Tsuchiko | |
| 9,006,820 | B2 | 4/2015 | Tsuchiko | |
| 2004/0113204 | A1 | 6/2004 | Tsuchiko | |
| 2005/0253216 | A1 | 11/2005 | Tsuchiko | |
| 2005/0258496 | A1 | 11/2005 | Tsuchiko | |
| 2009/0206375 | A1 * | 8/2009 | Saha | H01L 27/098 257/281 |
| 2009/0311837 | A1 * | 12/2009 | Kapoor | H01L 27/0611 438/186 |
| 2010/0301413 | A1 * | 12/2010 | You | H01L 27/0922 257/343 |
| 2011/0079825 | A1 | 4/2011 | Tsuchiko | |
| 2011/0201171 | A1 * | 8/2011 | Disney | H01L 21/76243 438/404 |
| 2013/0069154 | A1 | 3/2013 | Tsuchiko | |
| 2013/0069157 | A1 | 3/2013 | Tsuchiko | |
| 2013/0071994 | A1 | 3/2013 | Tsuchiko | |
| 2013/0072004 | A1 * | 3/2013 | Tsuchiko | H01L 21/8222 438/492 |
| 2014/0048846 | A1 | 2/2014 | Lui et al. | |
| 2014/0048880 | A1 | 2/2014 | Tsuchiko | |
| 2014/0138767 | A1 | 5/2014 | Lui et al. | |
| 2014/0167144 | A1 | 6/2014 | Tsuchiko | |
| 2014/0239382 | A1 | 8/2014 | Bobde et al. | |
| 2014/0264571 | A1 | 9/2014 | Lui et al. | |
| 2015/0129956 | A1 | 5/2015 | Lui | |
| 2015/0255595 | A1 * | 9/2015 | Hebert | H01L 29/66598 257/344 |

OTHER PUBLICATIONS

Hsu, Klaus YJ, and Tsu-Wei Chuang. "An input buffer with monolithic JFET in standard BCD technology for sensor applications." Electron Devices and Solid-State Circuits (EDSSC), 2015 IEEE International Conference on. IEEE, 2015.*

* cited by examiner

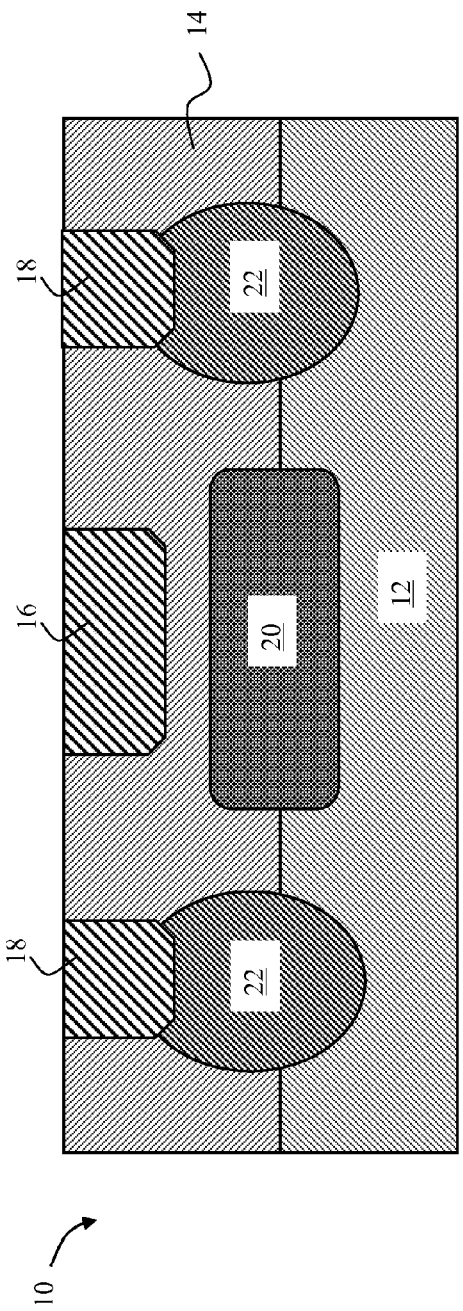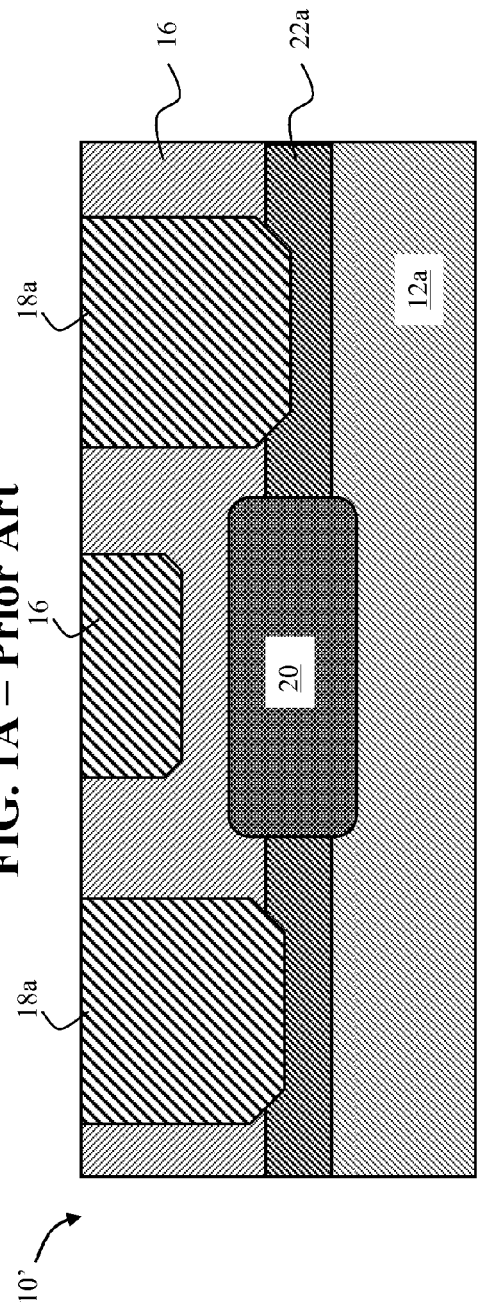
FIG. 1A – Prior Art
FIG. 1B – Prior Art

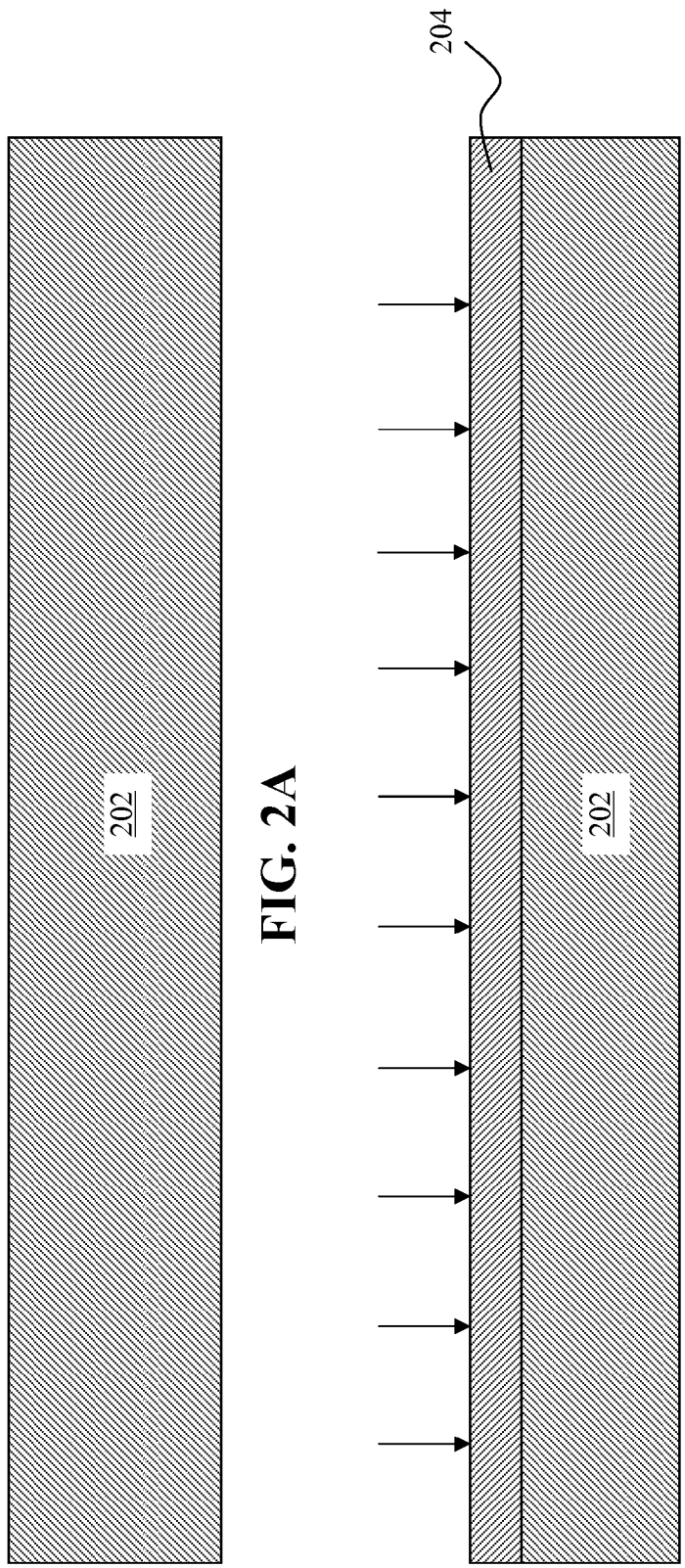

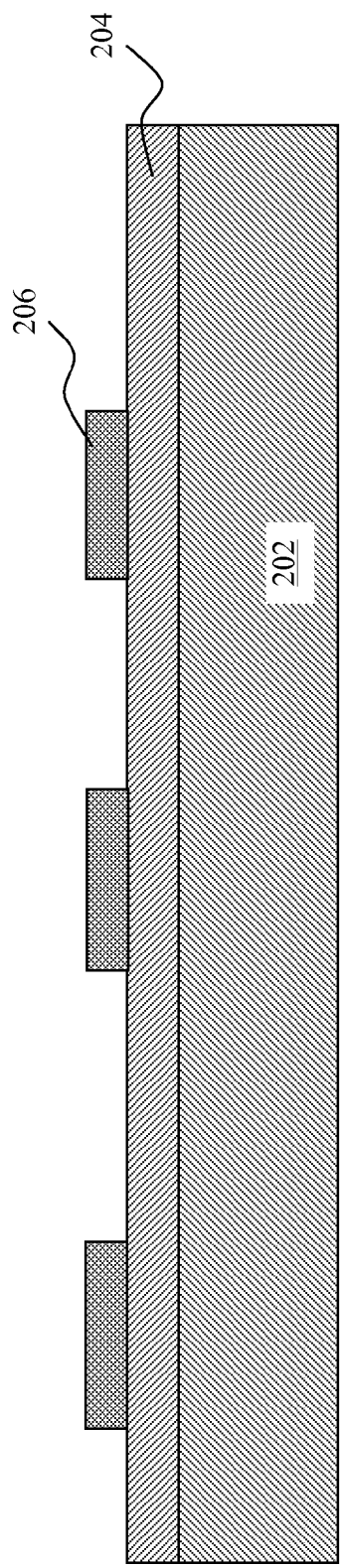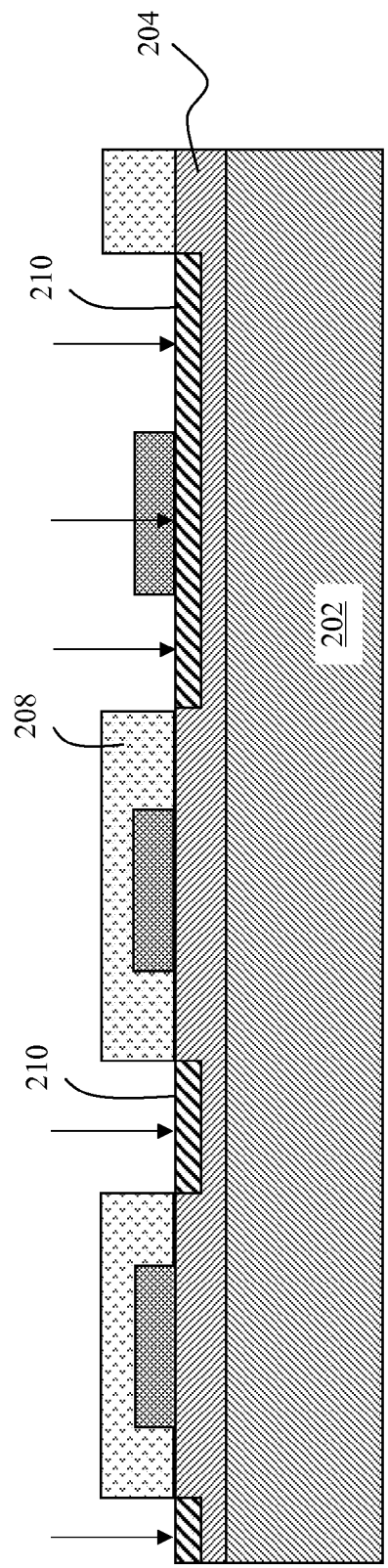
FIG. 2C
FIG. 2D

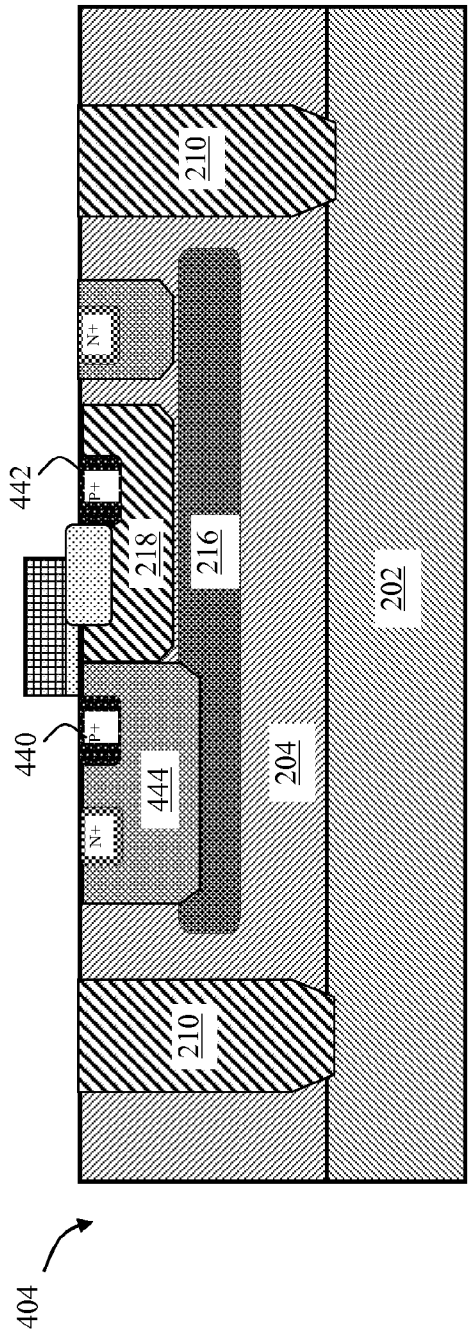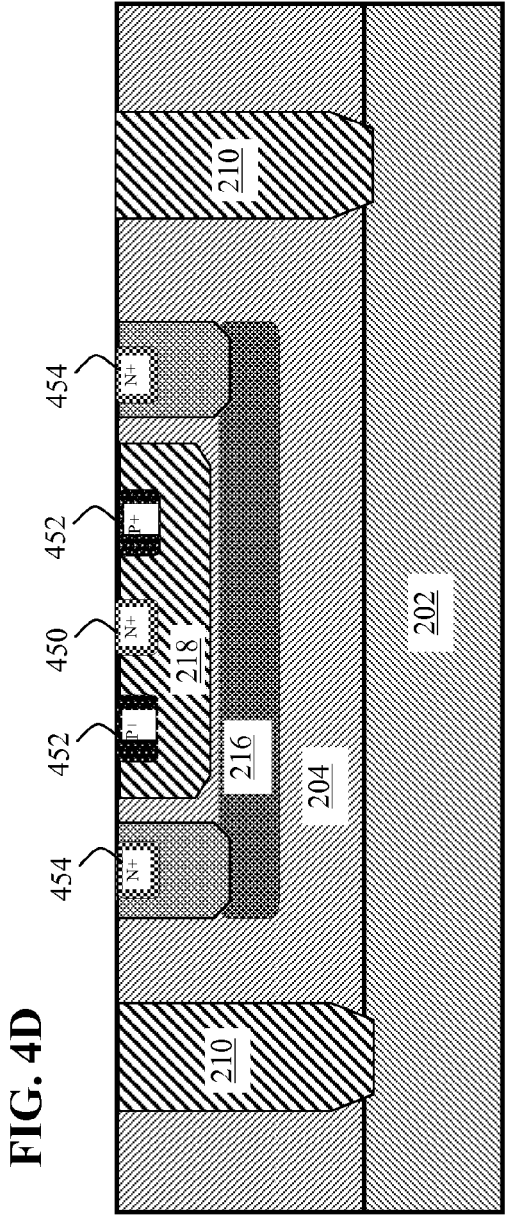
FIG. 4D
FIG. 4E

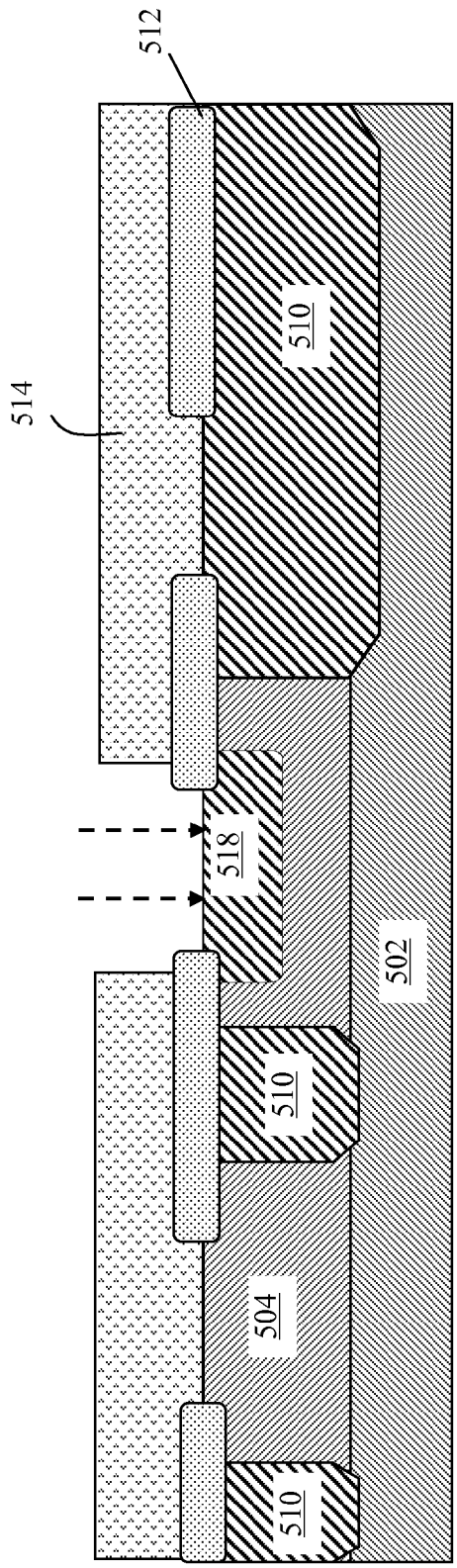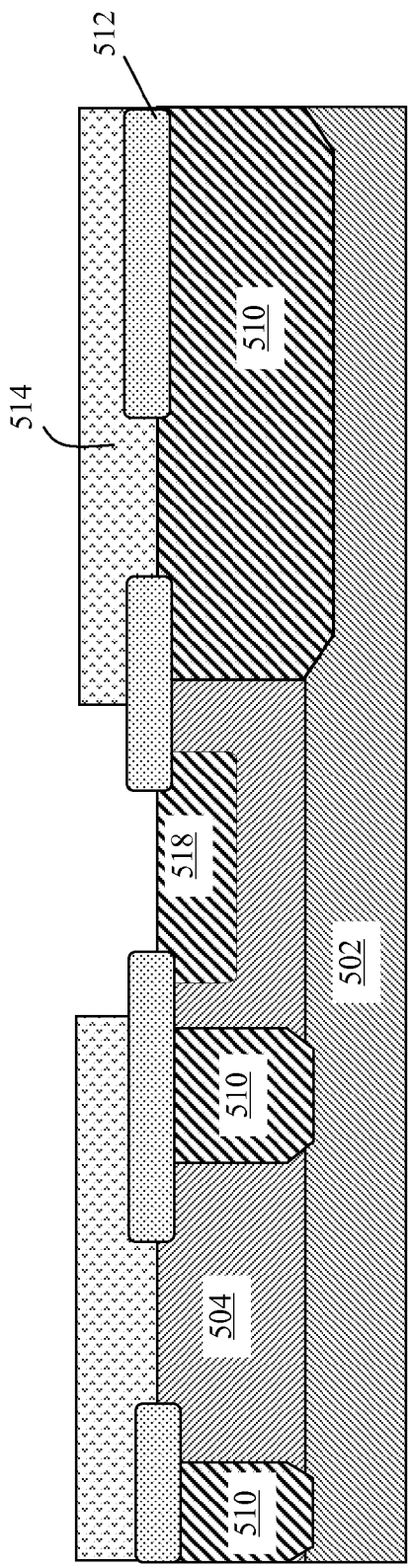
FIG. 5F-1
FIG. 5F-2

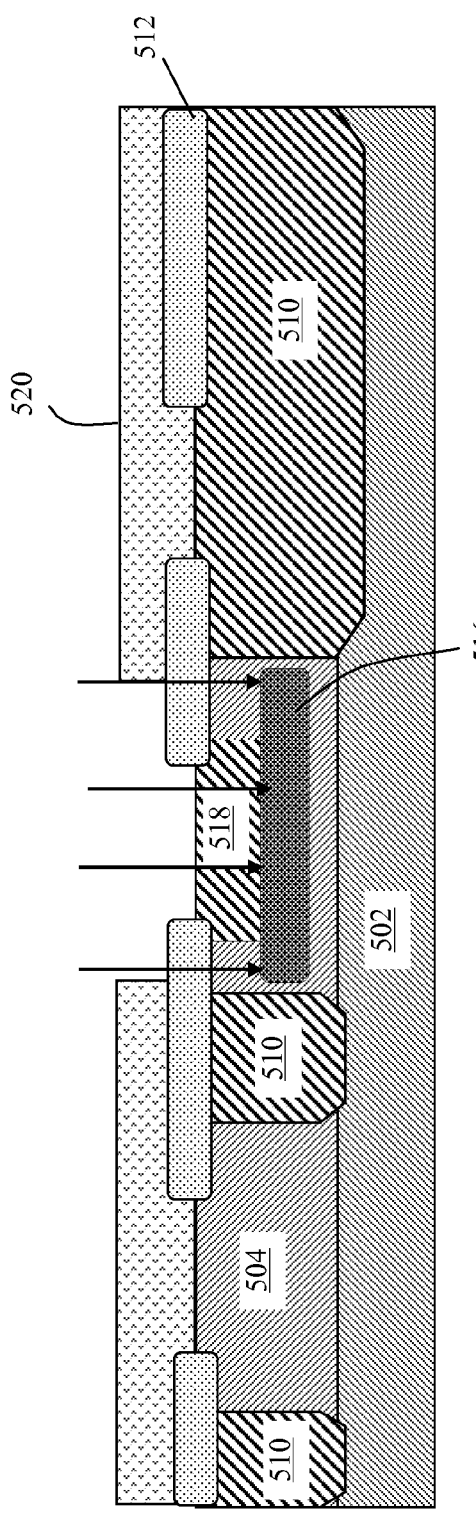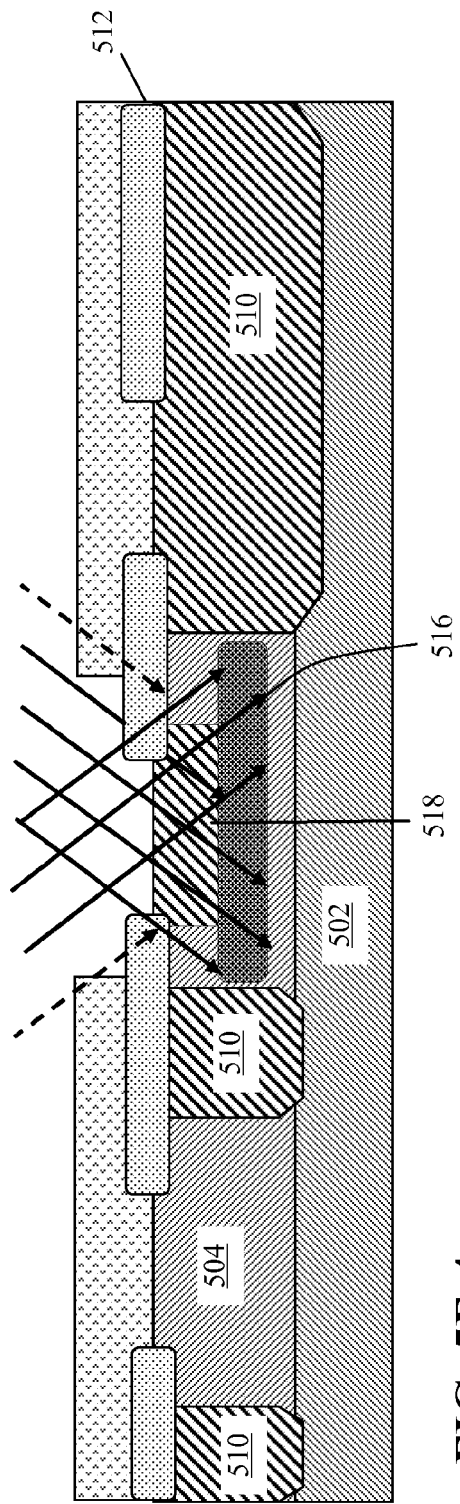
FIG. 5F-3
FIG. 5F-4

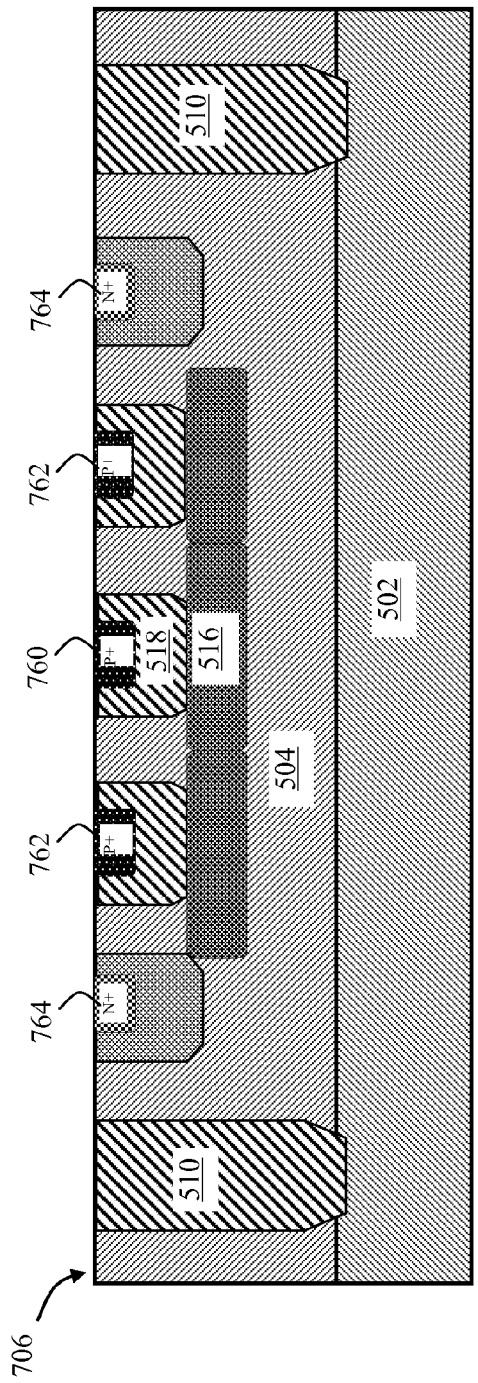
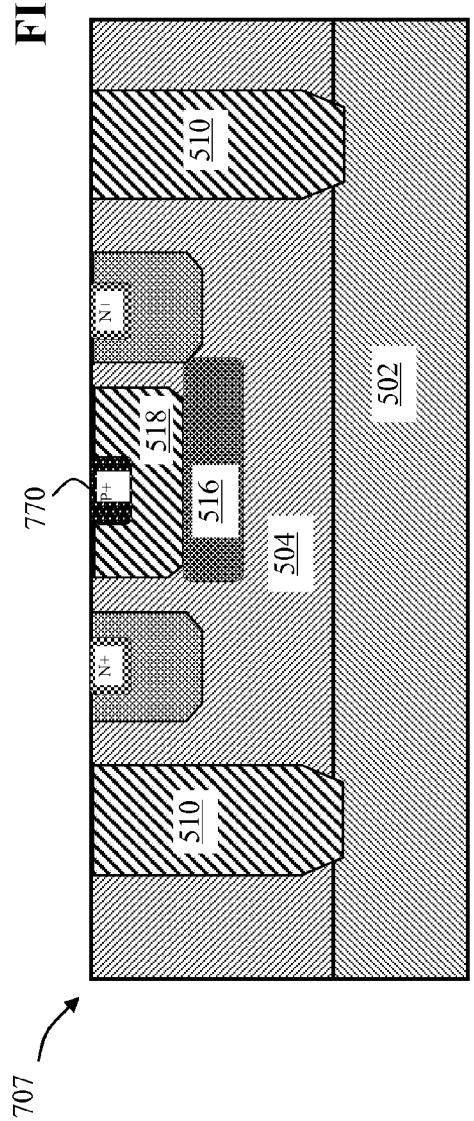
FIG. 7F
FIG. 7G

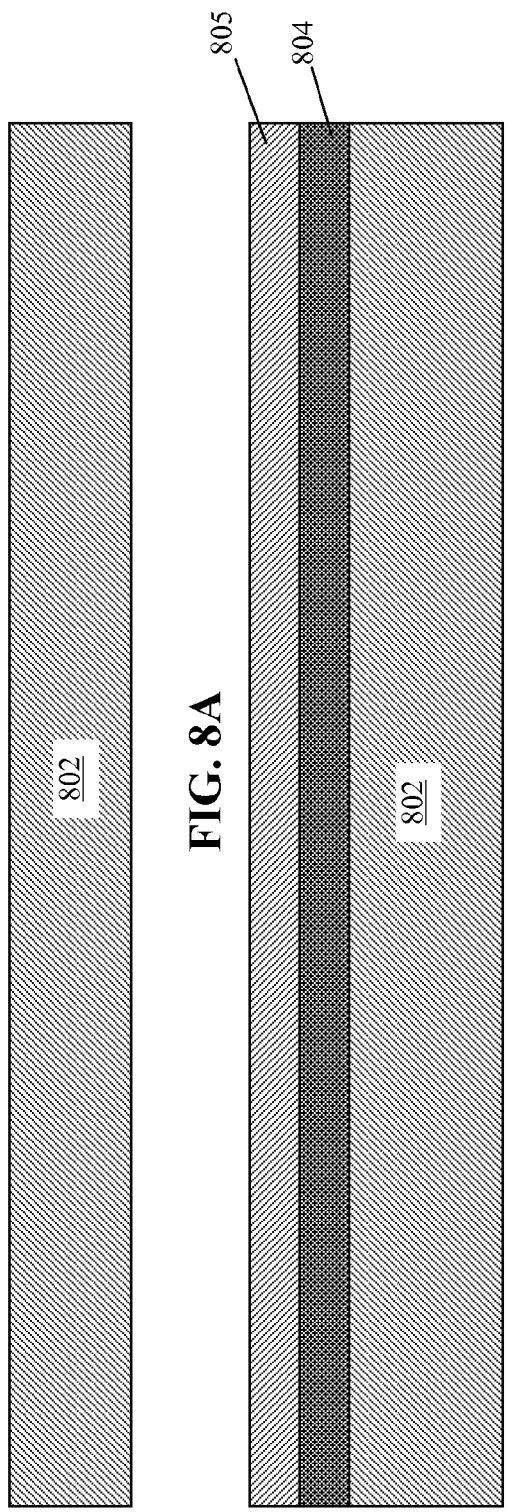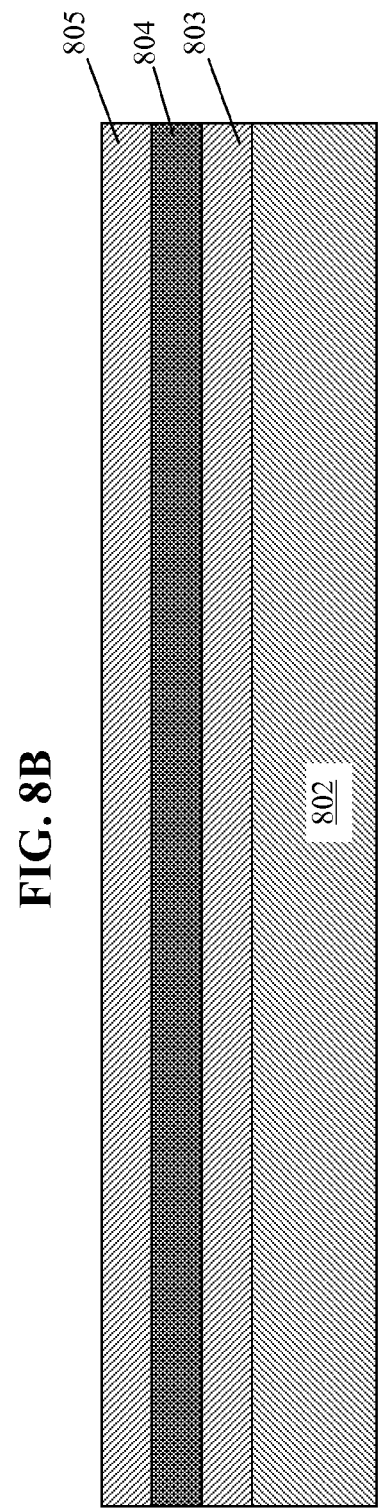

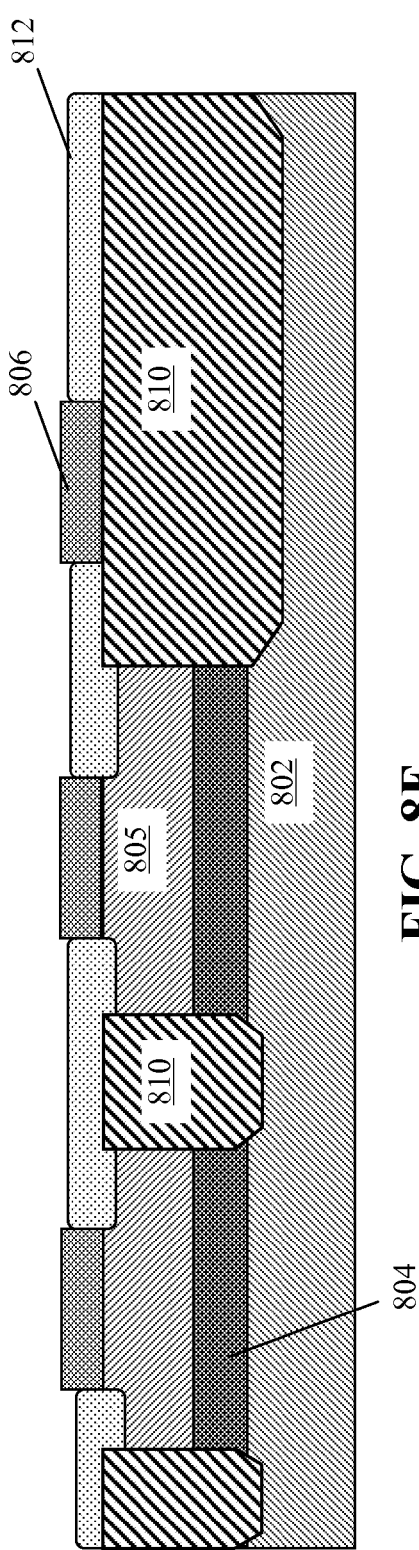
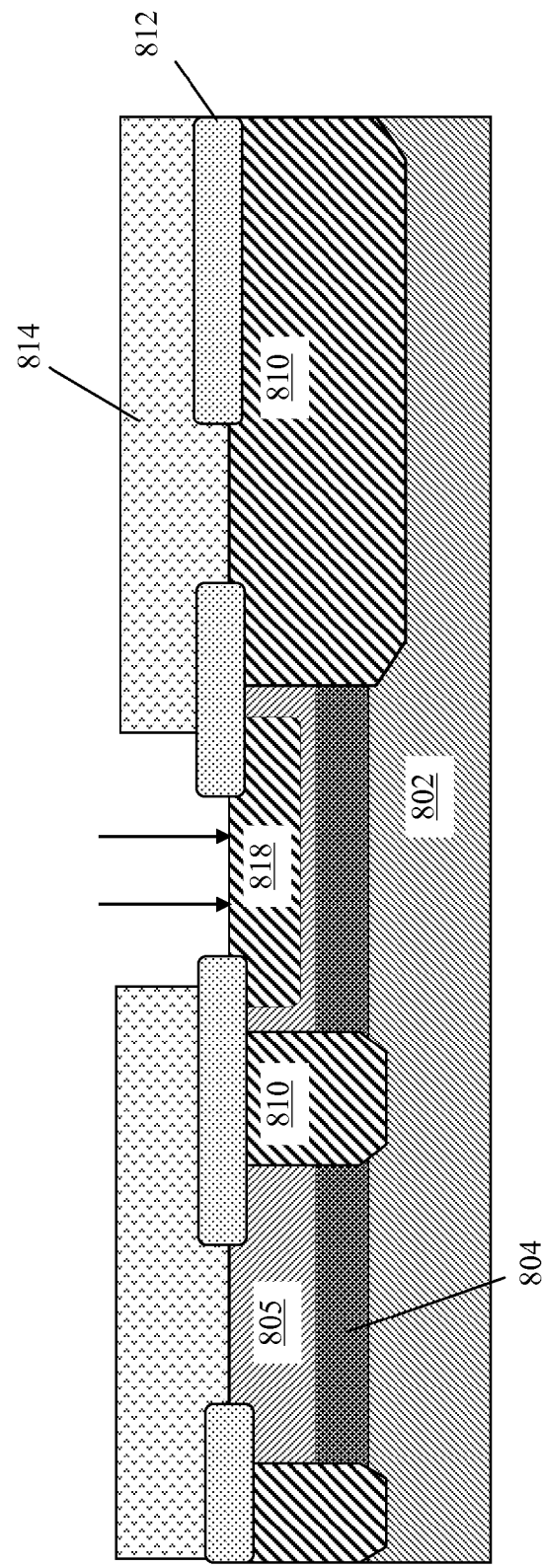
FIG. 8E
FIG. 8F

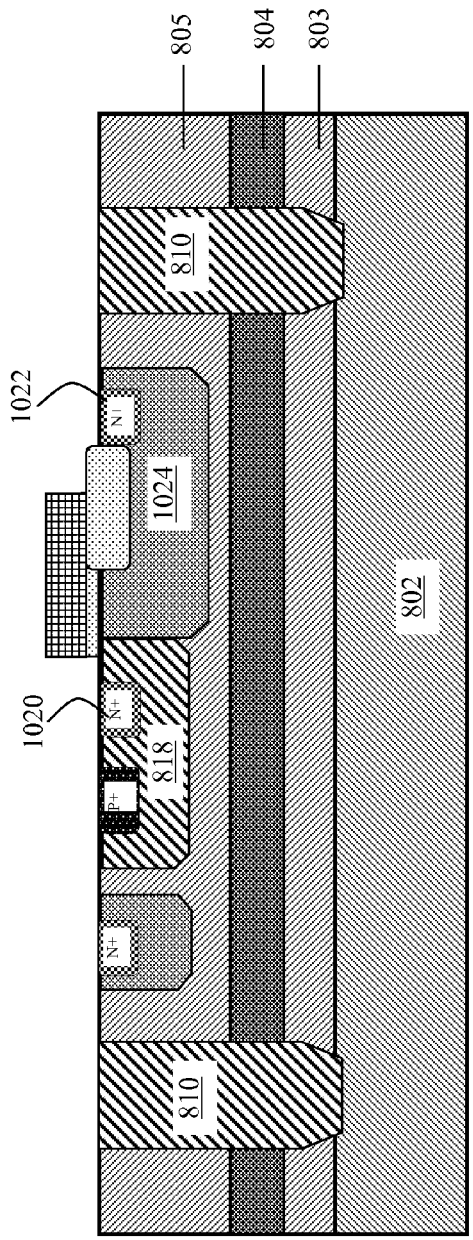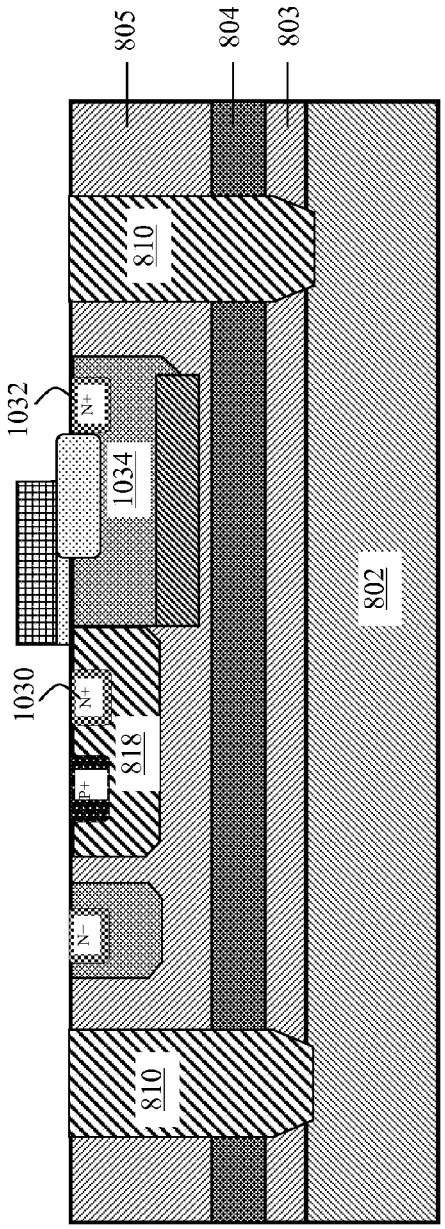
FIG. 10B
FIG. 10C

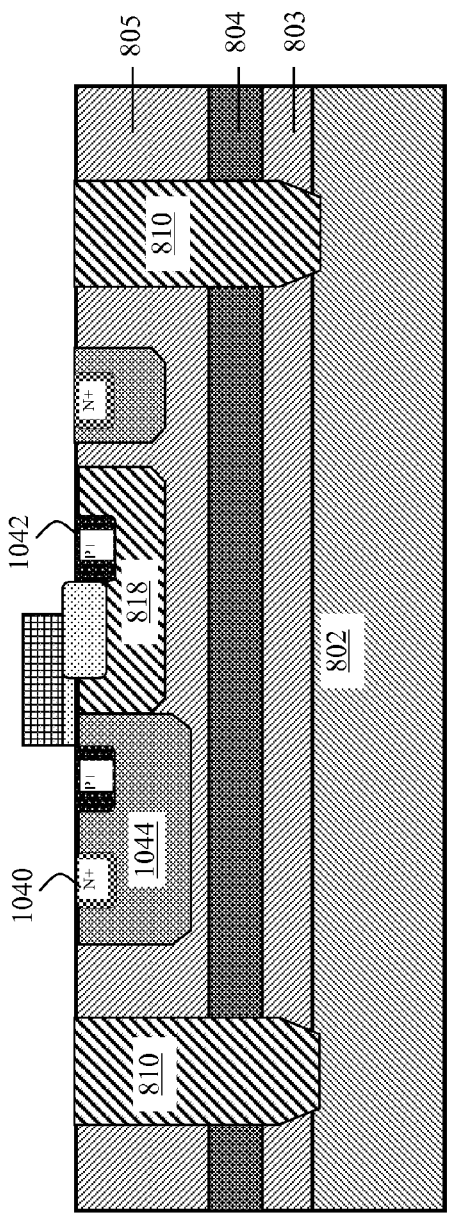
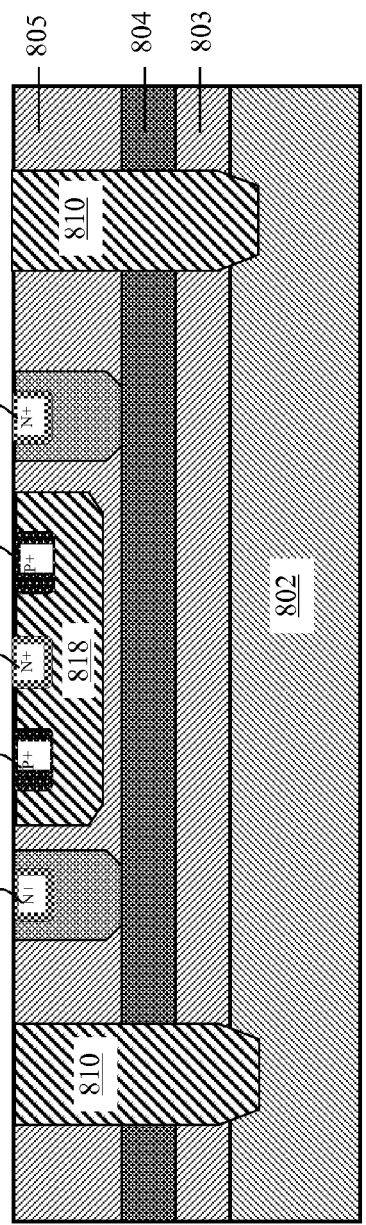
FIG. 10D
FIG. 10E

LOW COST AND MASK REDUCTION METHOD FOR HIGH VOLTAGE DEVICES

CLAIM OF PRIORITY

The present application is a continuation-in-part of commonly-assigned, U.S. patent application Ser. No. 13/237,842, filed Sep. 20, 2011, now U.S. Pat. No. 9,214,457.

FIELD OF THE DISCLOSURE

This present disclosure relates generally to semiconductor devices, and more particularly to integration of high voltage and low voltages devices onto the same integrated circuit and methods of fabricating the same.

BACKGROUND

Bipolar-CMOS-DMOS (BCD) process technology combines bipolar transistors, complementary metal-oxide-semiconductor (CMOS) devices and double diffused metal-oxide-semiconductor (DMOS) devices on a single chip. Bipolar devices are used for analog circuitry, CMOS devices are for logic circuitry and DMOS devices are for high voltage devices. The BCD device has advantages of high frequency and high power drive capability due to the bipolar transistors, low power consumption and high integration density due to the CMOS transistors, and excellent power controllability due to a low on-resistance between a drain and a source of each DMOS transistor and its large current and high breakdown voltage. Thus, BCD technology is often used for manufacturing high voltage power management integrated circuits or analog system-on-chip applications, with particular applications in wireless handheld electronics and consumer electronics.

Generally in BCD technologies, the highest operating voltage is limited by (1) reach-through breakdown of a vertical structure of P to N junction, (2) high voltage tub to p-substrate or ground and/or (3) other parameters. This vertical junction breakdown is a function of Epi thickness, doping concentration and junction depth. Thus, in addition to isolation of high voltage and low voltage devices, BCD technology requires an N-type stopper for having low voltage devices in a high voltage tub to prevent punch through. FIG. 1A shows an example of a BCD device 10 with conventional isolation and punch-through stopper configuration. The device 10 has an N-type epitaxial (N-epi) layer 14 disposed on a P-type substrate 12. Without showing the detailed structure of the device, a number of P-type regions (P-wells) 16 and 18 are provided in the N-epi layer 14. A dedicated mask is required to form a buried P-type regions 22 which extend from the bottoms of N-epi layer 14 upward into the bottom edge of P-wells 18 and merge together. Buried P-type regions 22 also extend downwards into the substrate 12, thus, providing isolation of the device 10 from the rest area of the semiconductor chip where other devices may be formed. Device 10 further comprises an N-type buried region 20 under the P-well 16 to prevent punch through between P-well 16 and P-type substrate 12 which limits the maximum operating voltage of the device 10. The N-type buried region 20 requires a dedicated mask to form in the process. Thus, the performance of device 10 may be optimized by using a certain thickness of N-epi layer 14 and controlling the depth of P-well 16 and the lateral distance between N-type buried region 20 and P-type buried region 22.

The manufacturing process would start with the substrate material 12 and ion implantation for regions 20 and 22 to be formed respectively in later steps. A dedicated zero mask is required by etching unused areas of the silicon to leave marks for alignment. The epitaxial layer 14 is then disposed on top of the substrate material 12 and multiple N-wells and P-wells are formed extending downwards from the top surface of the epitaxial layer. Additional steps may be carried out to form a specific function such as a bipolar transistor or a MOSFET. It is noted that a P-Epi layer may be used instead of N-Epi layer, but it requires an additional lightly doped N-well region deep enough to convert P- to N-. N Epi can form N-tub by only P-Iso.

Alternatively, a blanket implantation may be carried out to form a P-type buried layer 22a on top of the P-type substrate 12a as shown in FIG. 1B. In addition, P-well isolation regions 18a have to be deep enough to reach the P-type buried layer 22a. With this configuration, one less mask is used. While the configuration of FIG. 1B is good enough for the device with a relatively low operating voltage, e.g., less than 40 volts, the configuration of FIG. 1A is usually used when the device has a much higher operating voltage, e.g., 100 V or more.

Fabrication of the BCD device may need complex process technologies and a large number of photo masks. Forming the N-type buried region 20 and P-type buried layer 22 and lightly doped deep N-well regions (not shown) used to form N tubs requires high temperature long duration diffusion cycles. Furthermore, the epitaxy step is expensive. Therefore conventional BCD process flow is long and is expensive. Thus, manufacturing costs of the BCD device may be increased. Therefore, various process technologies for forming the BCD device may still be required to reduce the manufacturing costs and to improve performance thereof.

It is within this context that embodiments of the present invention arise.

BRIEF DESCRIPTION OF THE DRAWINGS

Objects and advantages of the invention will become apparent upon reading the following detailed description and upon reference to the accompanying drawings in which:

FIGS. 1A and 1B are cross-sectional schematic diagrams illustrating examples of conventional semiconductor devices.

FIGS. 2A-2G are a sequence of cross-sectional schematic diagrams illustrating a semiconductor device fabrication of using a low cost and mask reduction method according to one aspect of the present disclosure.

FIGS. 4A-4G are examples of various devices implemented according to aspects of the present disclosure.

FIG. 5F' is a cross-sectional schematic diagram depicting use of an angled implant to form a punch through stopper in a variation on the method depicted in FIGS. 5A-5F.

FIGS. 5F-1 to 5F-4 are a sequence of cross-sectional schematic diagrams illustrating another variation on the method depicted in FIGS. 5A-5F involving reducing photo resist thickness and widening openings prior to implant to form a punch through stopper.

FIGS. 7A-7G shows examples of various devices implemented according to aspects of the present disclosure.

FIGS. 8A-8F are a sequence of a sequence of cross-sectional schematic diagrams illustrating a method of fabrication of the device according to an aspect of the present disclosure.

FIG. 8B-1 is a cross-sectional schematic diagram illustrating a three layer structure that may be used in a variation on the method illustrated in FIGS. 8A-8F.

FIGS. 10A-10E shows examples of various devices implemented according to aspects of the present disclosure.

DESCRIPTION OF THE SPECIFIC EMBODIMENTS

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Embodiments of the present disclosure present a BCD device with an N-type punch through stopper formed under a P-type layer. The N-type punch through stopper may be formed either by blanket implantation or epitaxy deposition. The N-type punch through stopper under the P-type layer stops punch through to the P-type substrate. In addition, isolation structures for isolation of high voltage devices from low voltage devices may be formed either by high energy and low energy boron implants, and/or low energy boron implants followed by a high temp/long duration drive-in. Such BCD devices may be fabricated with minimal introduction of photo masks and processing steps according to embodiments of the present disclosure. Below describes three embodiments of forming the N-type punch through stopper under a p-type layer.

First Embodiment

Figure 2E:
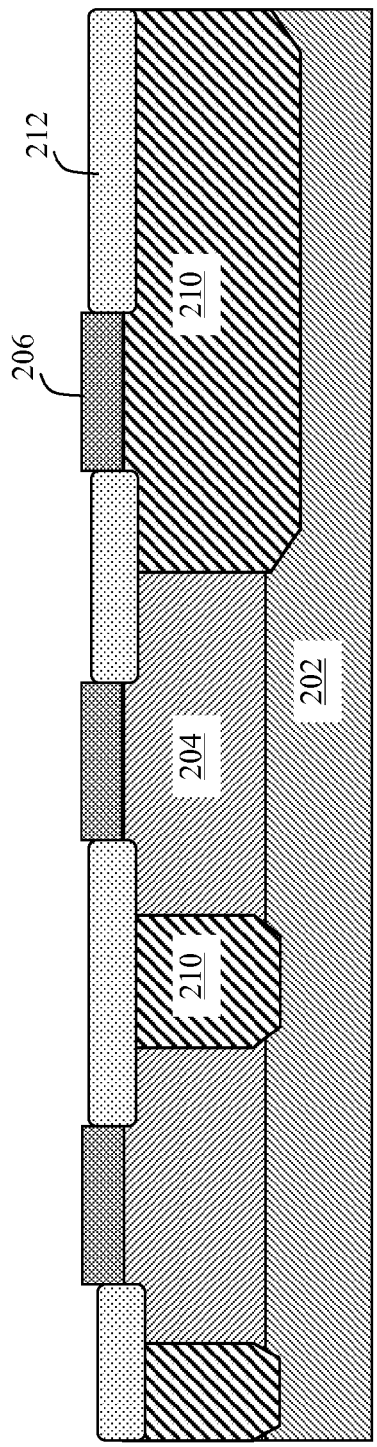

FIGS. 2A-2G are a sequence of cross-sectional schematic diagrams illustrating a method of fabrication of the device according to one embodiment of the present disclosure. As shown in FIG. 2A, the process starts with a P-type semiconductor substrate 202 as a starting material. The substrate 202 may be divided into multiple regions for forming devices of different operating voltage ratings. Each region is isolated by isolation structures as discussed below. For the sake of example, figures show a semiconductor device formed between two isolation structures. This is done to illustrate the general fabrication process and is not meant as a limitation on any embodiment of the invention. It is understood that the semiconductor device can be a bipolar transistor, a CMOS device or a DMOS device. It is further understood that any device combination can be integrated together in one single chip using the techniques disclosed in the disclosure below.

A screen oxide (e.g., a layer of silicon dioxide $SiO_2$) is first grown on the P-type substrate 202. The thickness of the screen oxide ranges from 200 to 300 Å. The screen oxide stops channeling and acts as a cap to protect the surface of the P-type substrate. A blanket phosphorous implant is then carried out to form an N-type layer 204 on top of the P-type substrate 202 as shown in FIG. 2B. The doping concentration of the N-type layer 204 is about $1\times10^{15}$ $cm^{-3}$.

In FIG. 2C, a layer 206 of silicon nitride (SiN) can be deposited on top of the N-type layer 204. The thickness of the SiN layer 206 may be about 1000 Å to about 2000 Å. A photoresist (not shown) is formed on the layer 206 and patterned as an active area mask. Portions of the layer 206 exposed to an etchant through openings in the photoresist are etched away to form the SiN pattern 206 and the etching stops at the surface of the N-type layer 204. Next, an isolation mask 208 is formed to define the isolation regions. That is, the isolation mask 208 covers the regions that are not to receive the boron implant for isolation structures. As shown in FIG. 2D, the isolation mask 208 is aligned to the SiN pattern 206 formed by the active area mask. As such, a zero mask for alignment can be omitted. A boron implant is then carried out to form one or more P-type isolation structures 210.

In FIG. 2E, a thermal field oxidation cycle is performed to grow field oxide 212 and also drives in both Phosphorous and Boron to form an N-type tub 204 and P-type isolation structures 210 respectively. That is, the N-type tub 204 and P-type isolation regions 210 can be formed by only one masking step using the isolation mask 208. It is noted that if shallow trench isolation (STI) is used, a liner oxidation cycle may be used for the drive-in.

Figure 2F:
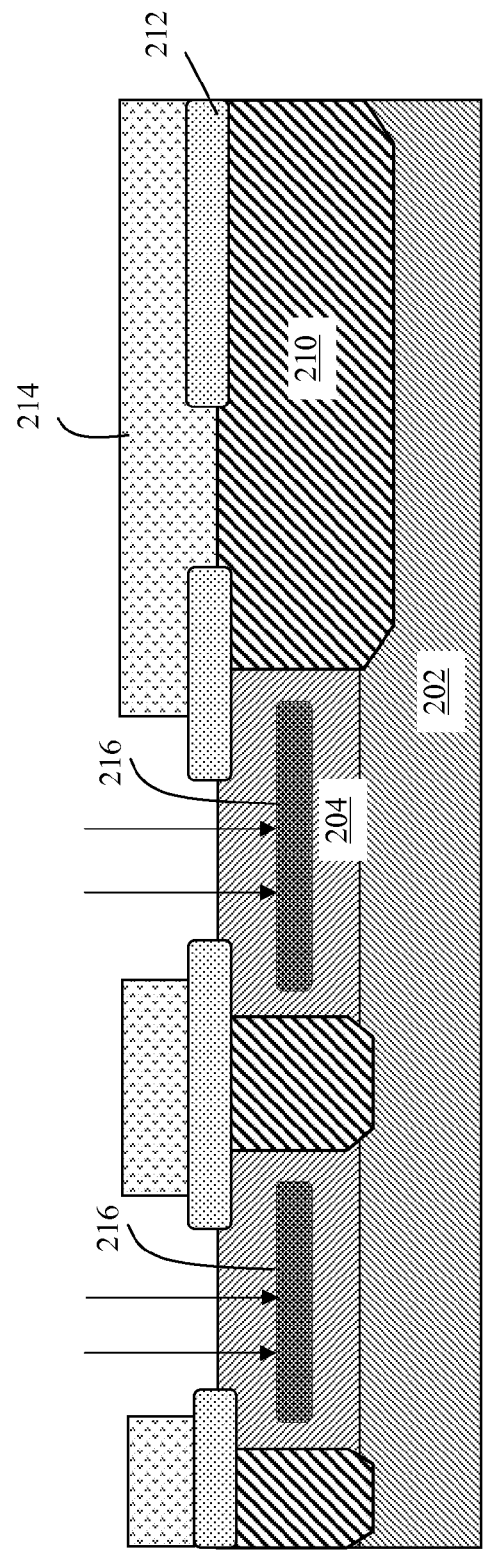
Figure 2G:
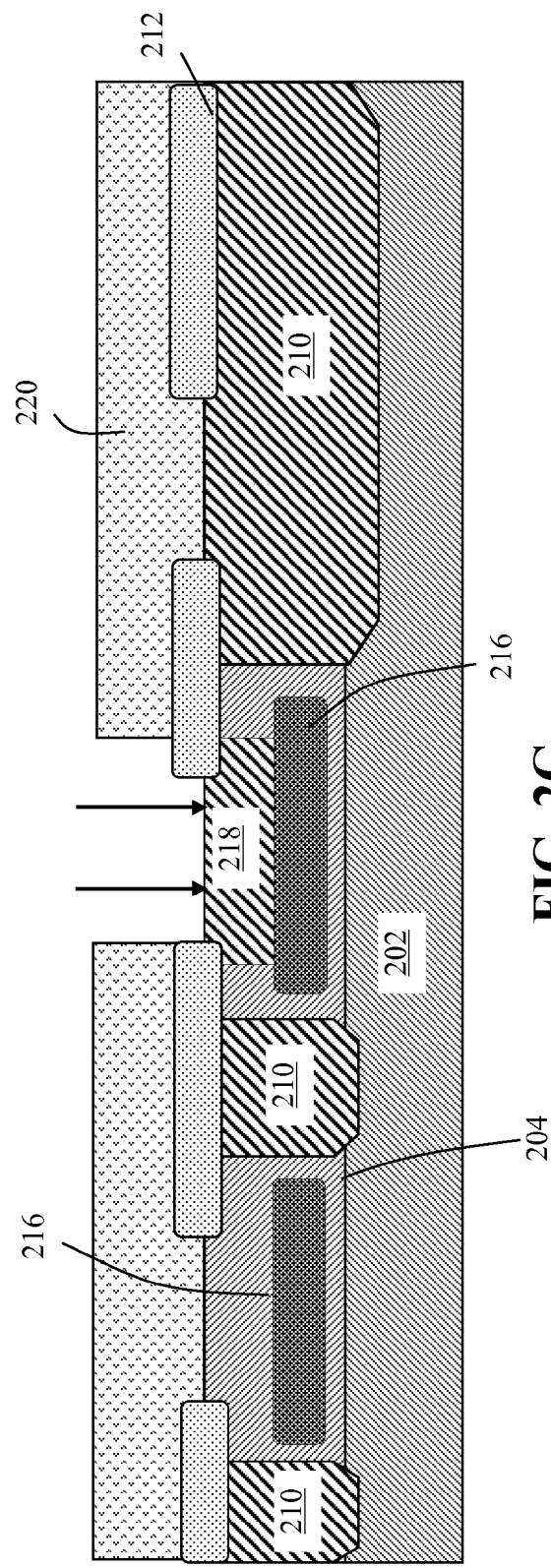

A deep N-well (DNW) mask 214 is formed to define the N buried layer (NBL) regions. A high energy implant is carried out through openings in the mask 214 to form a buried N-type punch through stopper 216 as shown in FIG. 2F. The DNW implant receives a low temp short duration diffusion, which preserves a sharply peaked implant profile. The punch though stopper 216 works as a highly doped N-type buried layer with a doping concentration ranging from about $1\times10^{17}$ $cm^{-3}$ to about $1\times10^{18}$ $cm^{-3}$. Thereafter, with another photo mask 220, a P-type implant (e.g., boron) is carried out with a medium implant energy to form a P-type layer/region 218 above the deeper N-type punch through stopper 216 as shown in FIG. 2G. It this example, the P-type region 218 has a width between two adjacent isolation structures that is less than that of the punch-through stopper 216. In some implementations, the P-type layer/region 218 can be P-WELL for LV NMOS body, P-BASE for VNPN base or P-DRIFT for PLDMOS drain extension. Since two separate masks are used for the N-type implant and P-type implant, the P-type layer 218 and the N-type punch through stopper 216 are in different sizes.

According to aspects of the present disclosure, major cost reduction can be obtained by omitting expensive Epitaxy and high temperature long duration diffusion cycles of NBL formation and DNW formation. In particular, a blanket phosphorous implant and field oxide formation can replace these expensive steps while still forming the desired N-tub regions. In addition to avoiding the need for an expensive epitaxial step, the method described with respect to the first embodiment can save cost and by avoiding the need for a zero mask and reducing masking and long duration high temperature diffusion process steps used to form the P-type isolation structures 210, N-buried layer punch through stopper 216 and the P-buried layer 218.

Figure 3:
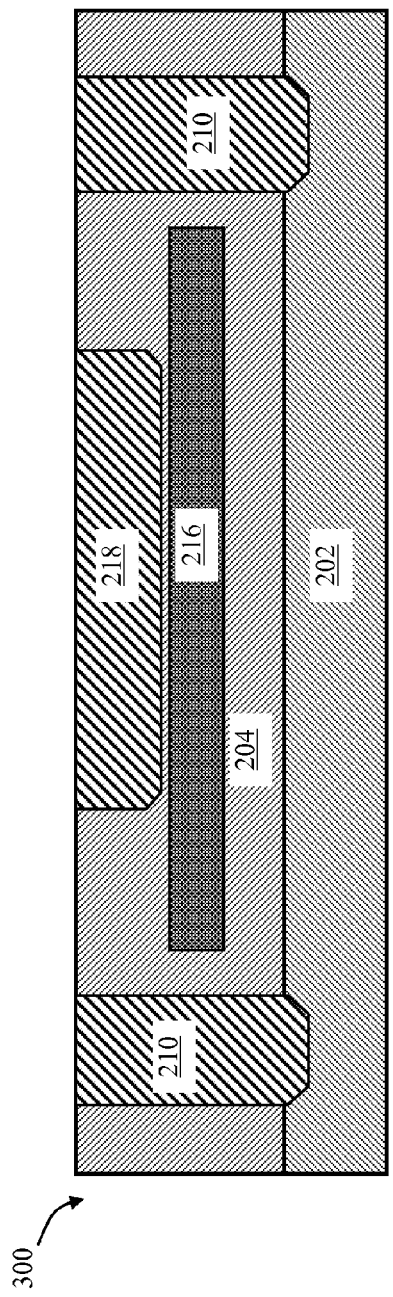
FIG. 3 is a cross-section schematic diagram illustrating a device with isolation structure and a punch through stopper manufactured according to the aspect of FIGS. 2A-2G.

FIG. 3 is a cross-section schematic diagram illustrating a device with isolation structures and a punch through stopper according to the above embodiment of the present disclosure. Specifically, a device may be formed in the N-type tub 204 above the N-type punch through stopper 216 and between two adjacent P-type isolation structures 210, wherein the P-type layer 218 above the punch through stopper 216 are narrower in width than the punch through stopper 216. The N-type punch through stopper 216 stops punch through or communication between the P-type layer/region 218 and the P-type substrate 202. It is understood that the device can be a bipolar transistor, a CMOS or a DMOS device. FIGS. 4A-4G shows examples of various devices implemented according to the embodiments of the present disclosure. These devices are well known to one of ordinary skill in the art and thus descriptions of functions and fabrication processes for these devices will be omitted for the sake of brevity.

Figure 4A:
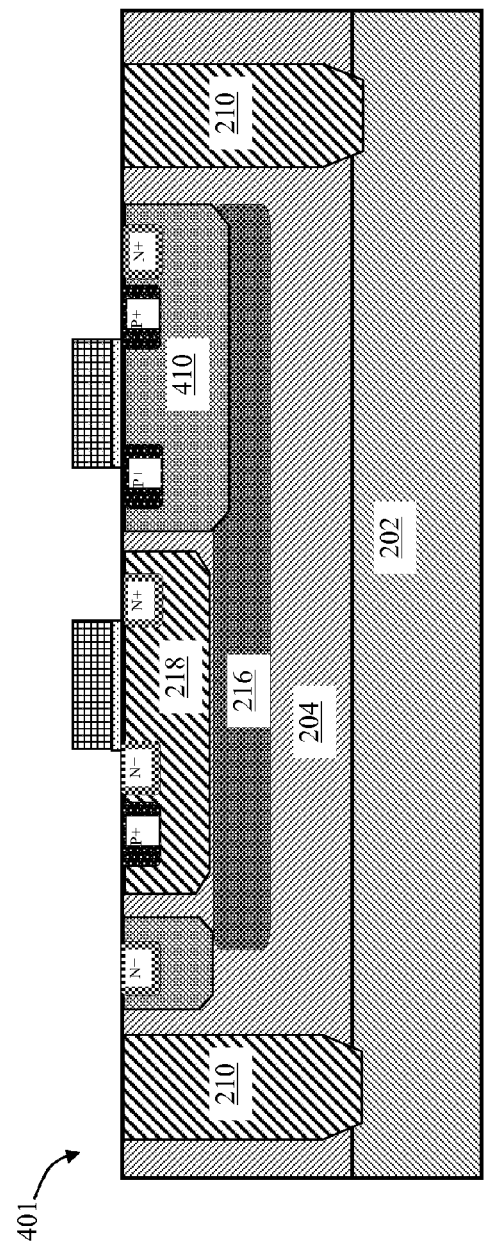

FIG. 4A shows the active area of device 401 is configured as a low voltage CMOS that include an NMOS formed in the P-well region (P-type layer/region) 218, and a PMOS formed in the N-well region 410. The operating voltage of the NMOS in the P-well region may range from 1-10 volts and may be floated to a higher potential than ground. Such devices have lower noise due to isolation of the device structures.

Figure 4B:
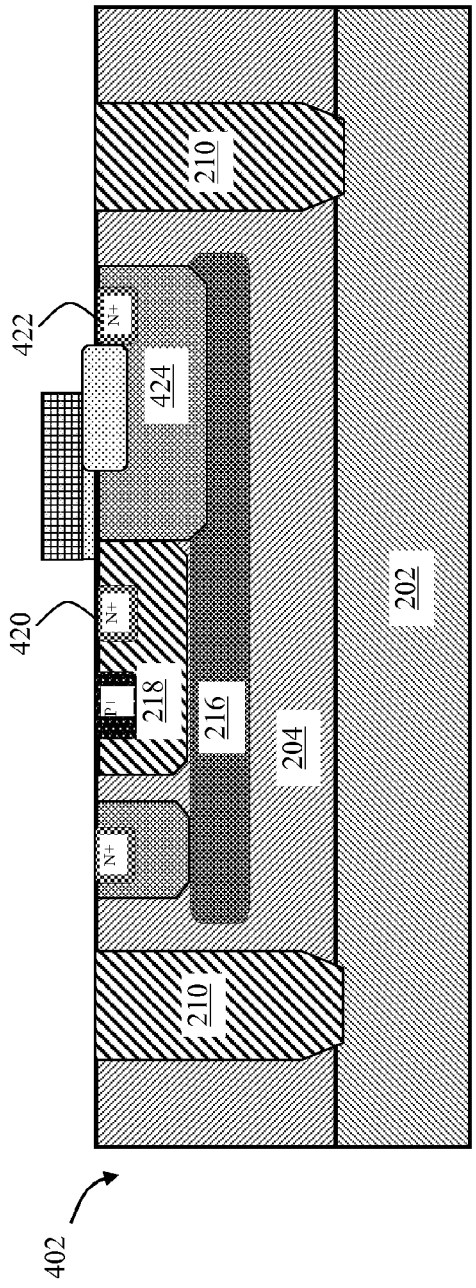

FIG. 4B shows an alternative embodiment in which the active area of device 402 is configured as an N-channel LDMOS that includes an N+ source region 420 disposed in P-well region 218 and an N+ drain contact pickup region 422 disposed in N-well or N-drift region 424.

Figure 4C:
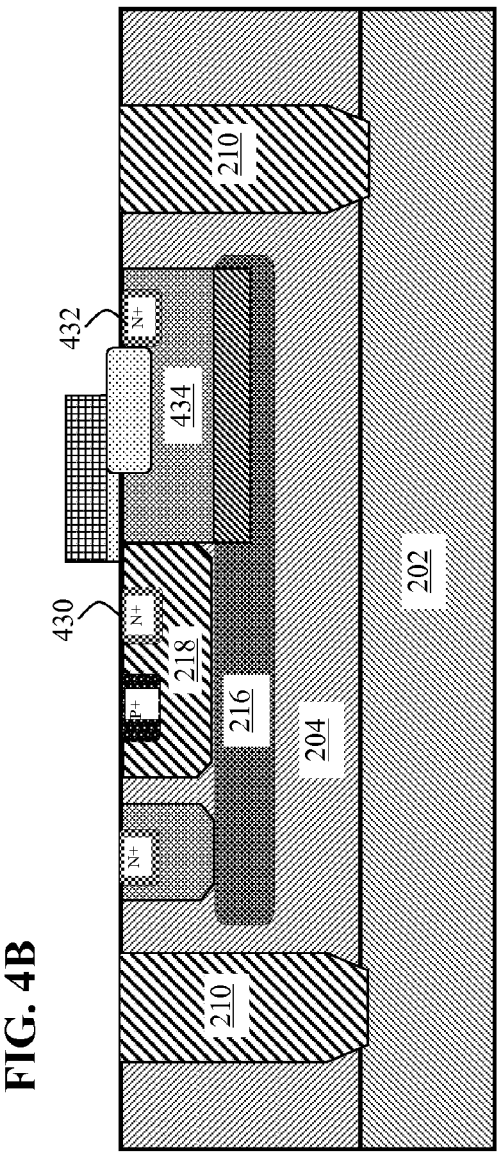

FIG. 4C shows an alternative embodiment of a double resurf NLDMOS device 403 formed in the N-type tub 204 between the two P-type isolation structures 210. The active area of device 403 includes an N+ source region 430 disposed in the P-well region 218 and an N+ drain contact pickup region 432 disposed in N-well region 434. The double resurf NLDMOS device 403 provides low resistance between the source and the drain during the on state ($R_{ds-on}$) in a lateral device.

FIG. 4D shows an alternative embodiment of a P-channel LDMOS device 404 formed in the N-type tub 204 between the two P-type isolation structures 210. A P-channel LDMOS 404 can be formed in a same way as shown in FIG. 4B, except that the P+ source region 440 is now disposed in N-well region 444 provided as the body and P+ drain contact pickup 442 is now disposed in P-well or P drift region 218 provided as the drain.

FIG. 4E shows an alternative embodiment of a high voltage vertical NPN transistor (VNPN) 405 formed between the two p-type isolation structures 210. The active area of device 405 includes a highly doped N+ region 450 disposed in the high voltage P-well region (HVPW) 218. The highly doped N+ region 450, the P-well region 218 and the N-type regions 216 and 204 below the P-well 218 configures a vertical NPN with N+ region 450 provided as the emitter, P-well 218 provided as the base and the N-type regions below the HVPW 218 provided as the collector. The P+ regions 452 disposed in HVPW 218 provide contact pickups to the base while the N-type regions 454 disposed in top portion of the N-type tub 204 outside of the HVPW 218 provide contact pickups to the collector.

Figure 4F:
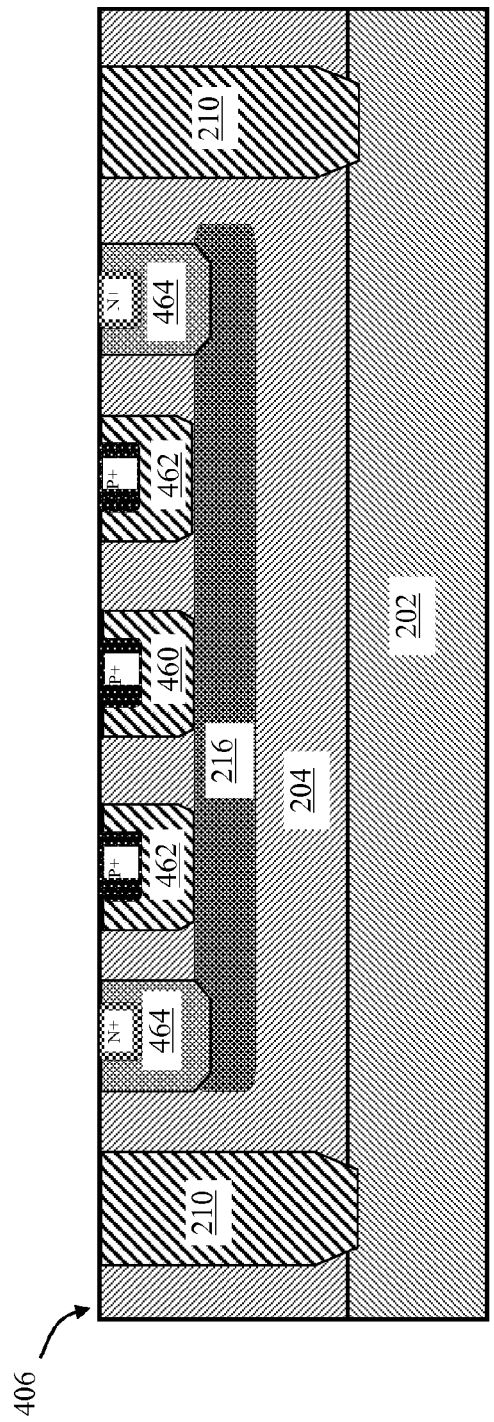

FIG. 4F shows an alternative embodiment in which the active area of device 406 is configured as a lateral PNP (LPNP) including a P region 460 provided as the emitter, a P ring 462 provided as the collector encircling the central P emitter region 460, and a N ring 464 provided as base contact pickup encircling the collector P ring 462 and the emitter P region 460.

Figure 4G:
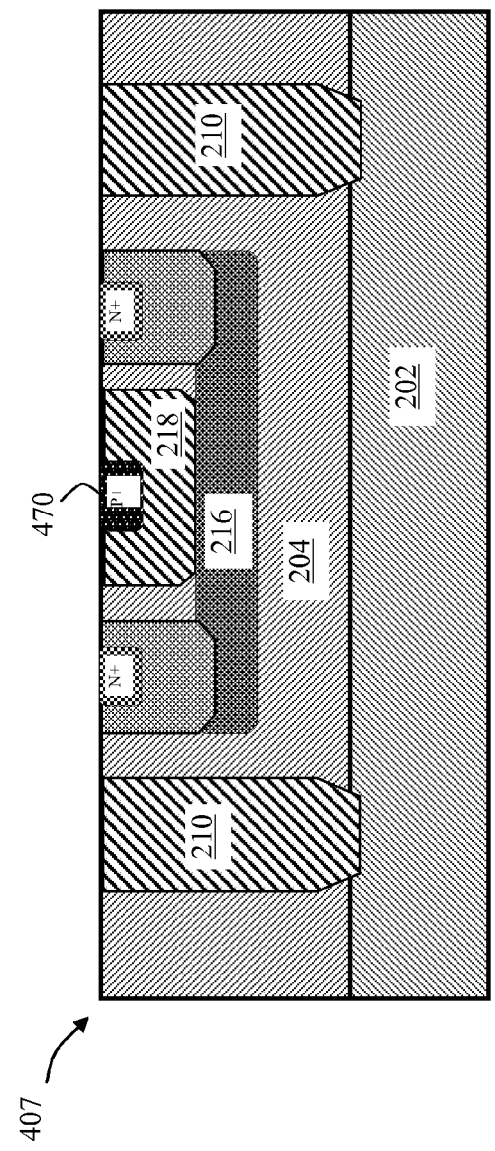

FIG. 4G shows an alternative embodiment of an N-type junction gate field-effect transistor (NJFET) 407 formed between the two p-type isolation structures 210. The active area of the device 407 includes a highly doped P+ region 470 disposed in P-well region 218 provided as the gate. The gate contacts the N-type region 216 forming a PN junction.

Second Embodiment

Figure 5A:
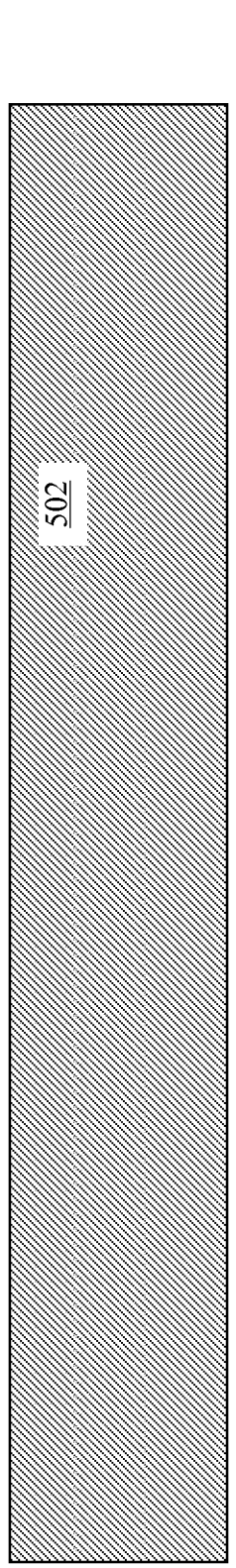
FIGS. 5A-5F are a sequence of cross-sectional schematic diagrams illustrating a method of fabrication of the device according to an aspect of the present disclosure.

FIGS. 5A-5F are a sequence of a sequence of cross-sectional schematic diagrams illustrating a method of fabrication of the device according to one embodiment of the present disclosure. In FIG. 5A, the process uses a P-type semiconductor substrate 502 as a starting material. The substrate 502 may be divided into multiple regions for forming devices of different operating voltage ratings. Each region is isolated by isolation structures as discussed below. For the sake of example, figures show a semiconductor device formed between two isolation structures. This is done to illustrate the general fabrication process and is not meant as a limitation on any embodiment of the invention. It is understood that the semiconductor device can be a bipolar transistor, a CMOS device or a DMOS device. It is further understood that any device combination can be integrated together in one single chip using the techniques disclosed in the disclosure below.

Figure 5B:
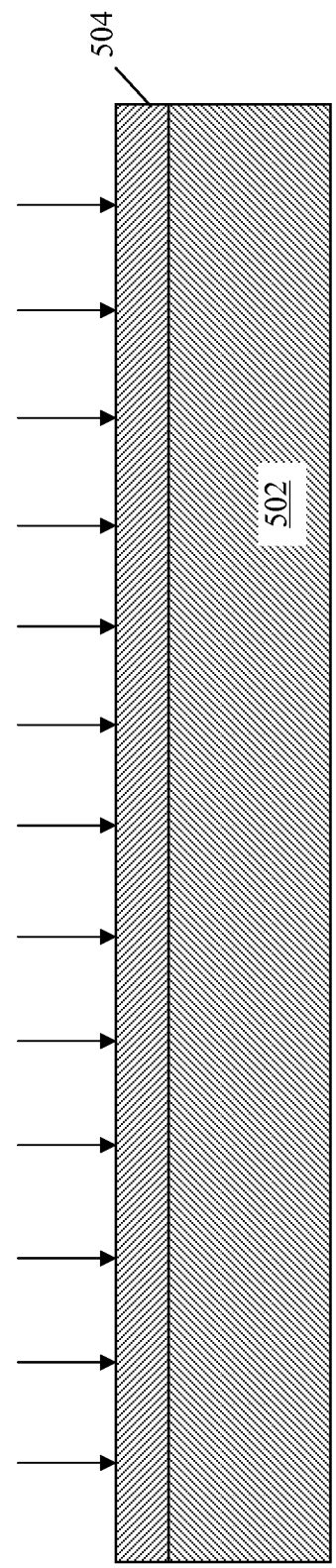

After growing a screen oxide (e.g., a layer of silicon dioxide $SiO_2$) for a thickness of 200 to 300 Å on the P-type substrate 502, a blanket phosphorous implant is then carried out to form an N-type layer 504 on top of the P-type substrate 502 as shown in FIG. 5B. The doping concentration of the N-type layer 204 is about $1 \times 10^{15}$ cm$^{-3}$.

Figure 5C:
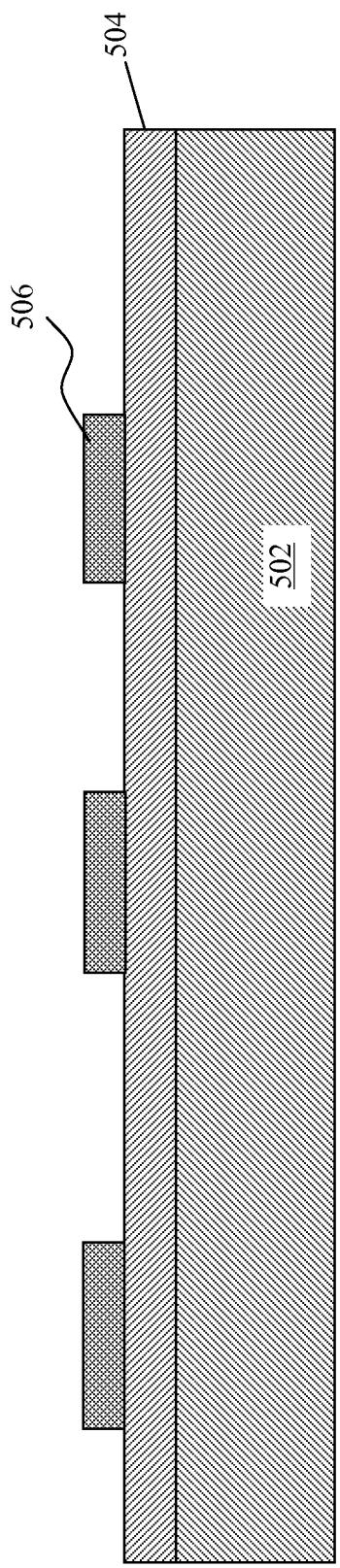
Figure 5D:
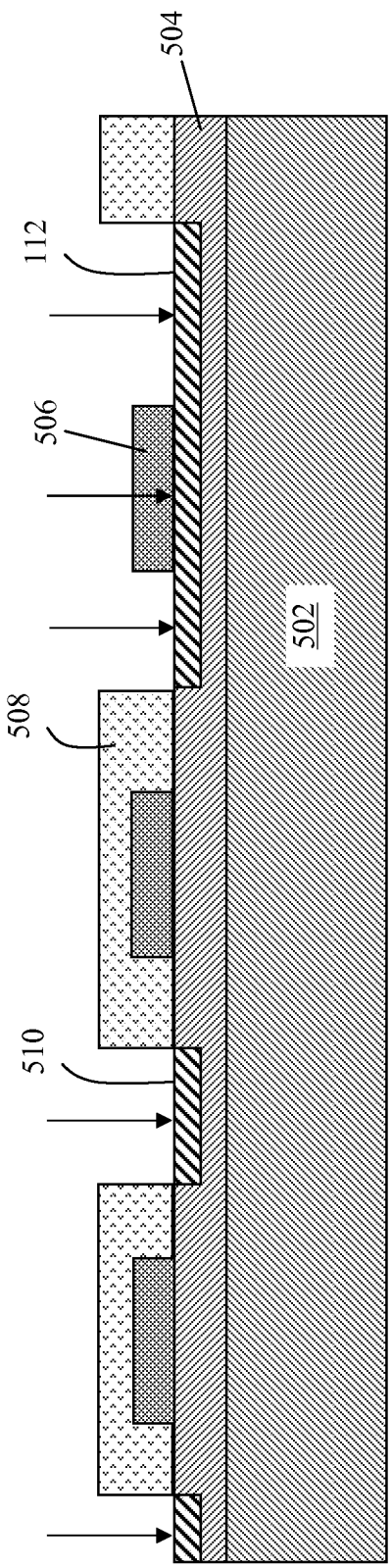

In FIG. 5C, a layer 506 of silicon nitride (SiN) can be deposited on top of the N-type layer 504. The thickness of the SiN layer 506 may be about 1000 Å to about 2000 Å. A photoresist (not shown) is formed on the layer 506 and patterned as an active area mask. Portions of the layer 506 exposed to an etchant through openings in the photoresist are etched away to form the SiN pattern 506 and the etching stops at the surface of the N-type layer 504. Next, an isolation mask 508 is formed to define the isolation regions. That is, the isolation mask 508 covers the regions that are not to receive the boron implant for isolation structures. As shown in FIG. 5D, the isolation mask 508 is aligned to the SiN pattern 506 formed by the active area mask. As such, a zero mask for alignment can be omitted. A boron implant is then carried out to form P-type isolation layers 510.

Figure 5E:
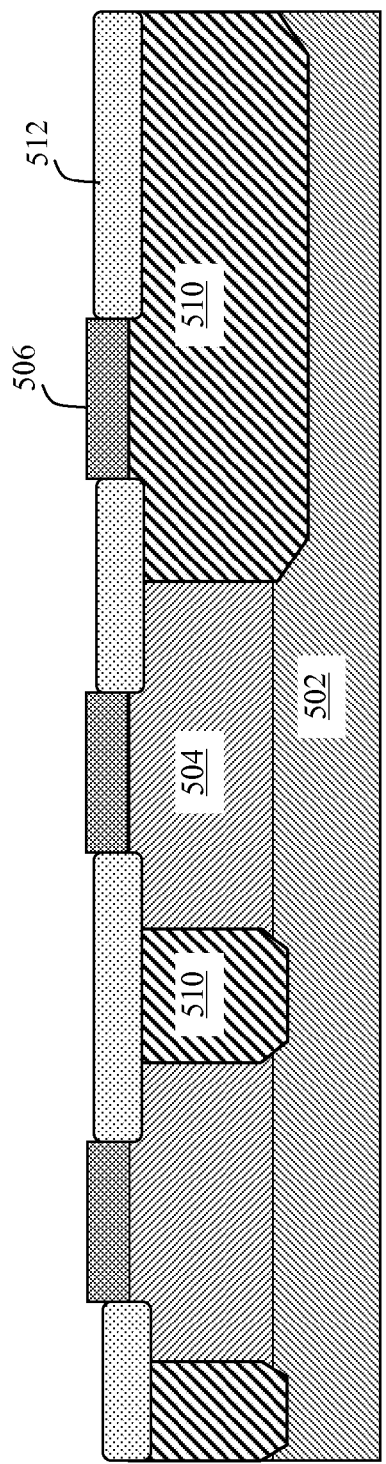

In FIG. 5E, a thermal field oxidation cycle is performed to grow field oxide 512 and also drives in both Phosphorous and Boron to form an N-type tub 504 and P-type isolation regions 510 respectively. That is, the N-type tub 504 and P-type isolation regions 510 can be formed by only one masking step using the isolation mask 508. It is noted that if shallow trench isolation (STI) is used, liner oxidation cycle will work as the drive-in.

Figure 5F:
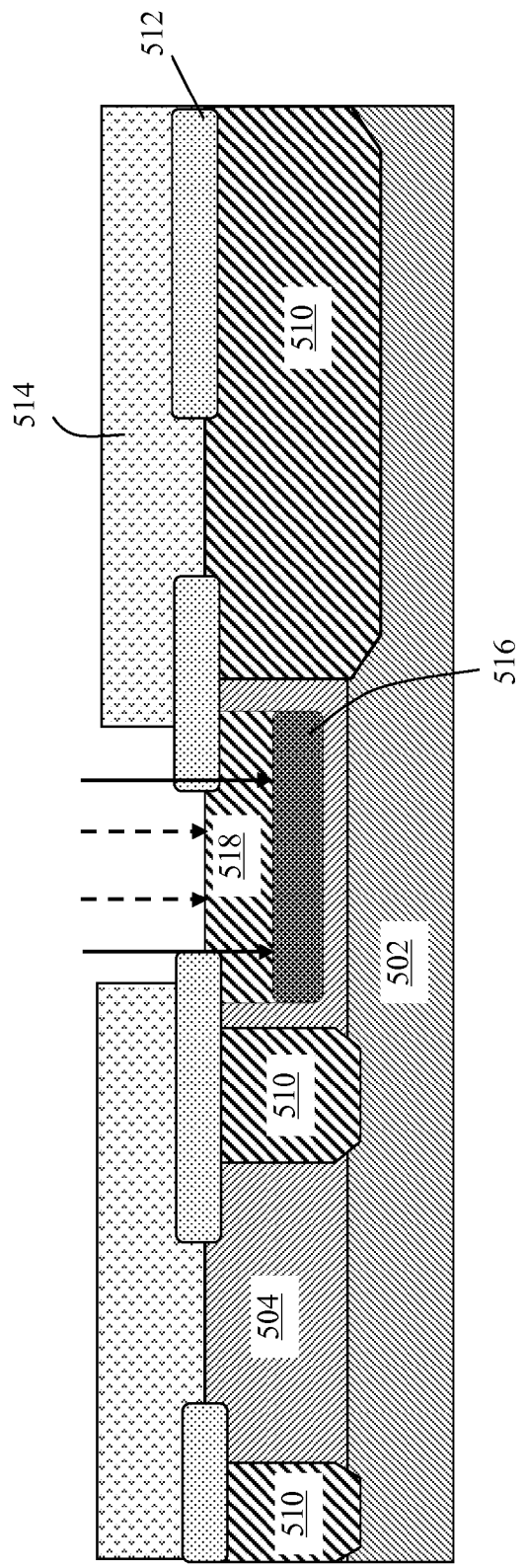
Figure 5F:
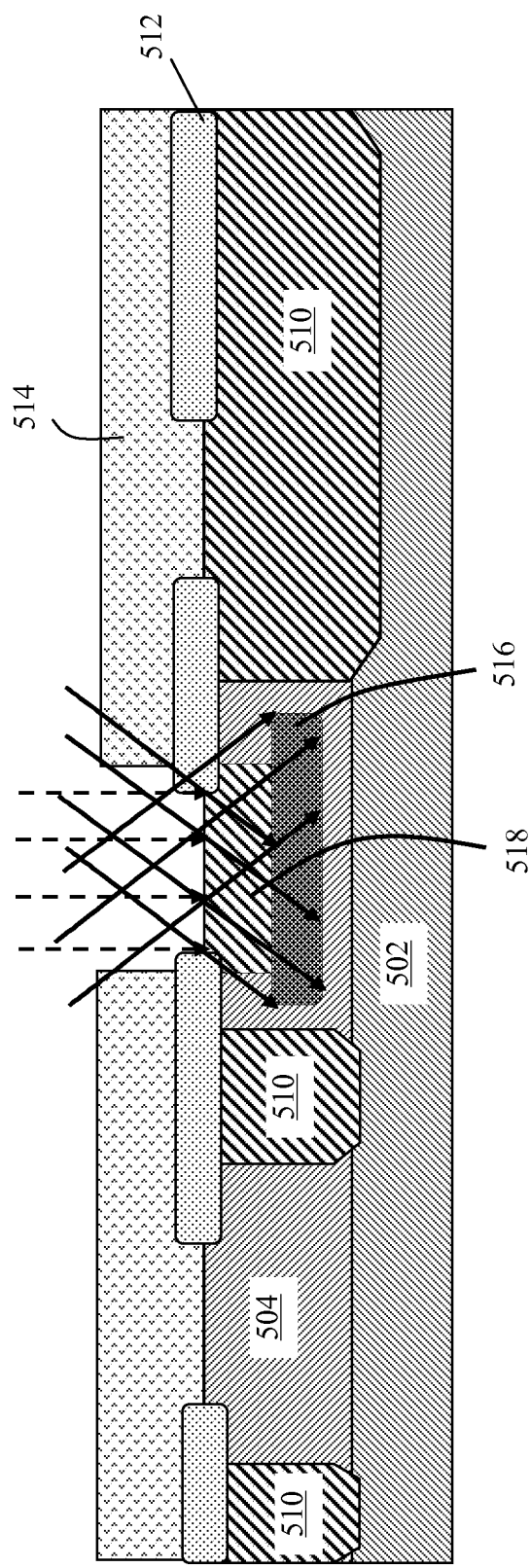

FIG. 5F shows that a highly doped N type implant at higher energy and P type implant at lower energy can be done using one masking step. That is, a deep N-well (DNW) masking step may be omitted. Specifically, with the photo mask 514, a high energy N-type implant (e.g., phosphorous) is carried out to form an N-type punch through stopper 516, and a P-type implant (e.g., boron) is carried out with a medium implant energy to form a P-type layer/region 518 above the deeper n-type punch through stopper 516. The N-type punch through stopper 516 is heavily doped with a doping concentration ranging from about $1\times10^{16}$ cm$^{-3}$ to about $1\times10^{18}$ cm$^{-3}$. The DNW implant then receives a low temp short duration diffusion, which preserves a sharply peaked implant profile. In some implementations, the P-type layer/region 518 can be P-WELL for LV NMOS body, P-BASE for VNPN base or P-DRIFT for PLDMOS drain extension. It is noted that the N-type punch through stopper 516 and the P-type layer/region 518 are of about the same width because one single mask is using for both N-type and P-type implants. In this configuration, the highly doped N type punch through stopper 516 under the P type layer 518 stops punch through between the P type layer 518 and the P-type substrate 502.

It is desirable to have a wider N type punch through stopper 516 than the P type layer 518 to prevent from punch through from the corner of the P type layer 518 to the P-type substrate 502. FIG. 5F' illustrates a possible implementation in which an angled implant is used to form a punch though stopper 516 that is wider than the P-type layer 518. Angled implant typically involves directing a beam of ions at the substrate at an angle to the surface of the substrate while rotating the substrate about an axis perpendicular to the surface. By controlling the angle and energy of implant the N-type dopants implanted the punch through stopper 516 may be made deep enough and wide enough to avoid the punch through.

In another possible implementation, a partial ashing of the photoresist 514 may be performed between the medium energy P-type implant and the high energy N-type implant as shown in FIG. 5F-1 to 5F-3. Specifically, after the process of FIG. 5E, a photoresist 514 is formed on the structure of FIG. 5E and is patterned as shown in FIG. 5F-1. A medium energy P-type implant is performed to form the P-type layer 518. Next, a partial ashing of the photoresist 514 is carried out to reduce the thickness of the photoresist 514 and increase the width of the mask opening as shown in FIG. 5F-2. In FIG. 5F-3, a high energy N-type implant is carried out to form the N type punch through stopper 516 under the P-type layer 518. As shown in FIG. 5F-3, the deeper N type punch through stopper 516 is wider than the P-type layer 518 formed above. In an optional further enhancement, an angled implant may be carried out for the N-type implant to make the punch through stopper 516 even wider as shown in FIG. 5F-4.

Figure 6:
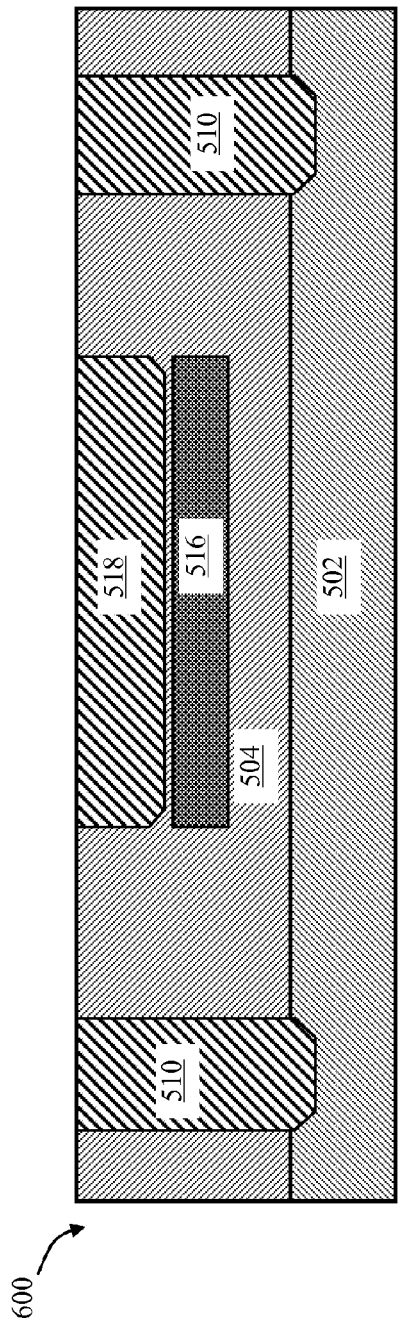
FIG. 6 is a cross-section schematic diagram illustrating a device with isolation structures and a punch through stopper according to the aspect illustrated in FIG. 5A-5F.

FIG. 6 is a cross-section schematic diagram illustrating a device 600 with isolation structures and a punch through stopper according to the above embodiment of the present disclosure. Specifically, a device may be formed in the N-type tub 504 above the N-type punch through stopper 516 and between two adjacent P-type isolation structures 510, wherein the P-type layer 518 above the punch through stopper 516 are about the same size. The N-type punch through stopper 516 stops punch through between the P-type layer/region 518 and the P-type substrate 502. It is understood that the device can be a bipolar transistor, a CMOS or a DMOS device. Like the method described above with respect to the first embodiment, the method of the second embodiment also avoids the need for a zero mask and an epitaxial layer. In addition, the method described with respect to the second embodiment can save cost and reduce masking steps and avoid long duration high temperature diffusion steps in forming the P-type isolation structures 510, N-buried layer punch through stopper 516 and the P-buried layer 518.

FIGS. 7A-7G shows examples of various devices implemented according to the embodiments of the present disclosure. These devices are well known to one of ordinary skill in the art and thus descriptions of functions and fabrication processes for these devices will be omitted.

Figure 7A:
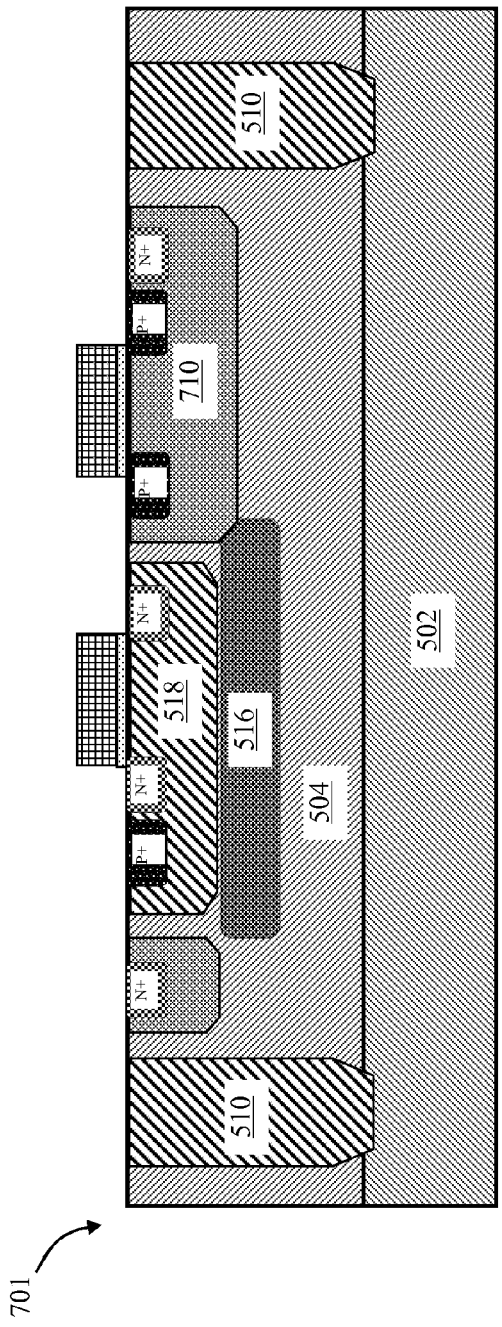

FIG. 7A shows a low voltage CMOS device 701 formed in the N-type tub 504 between the two P-type isolation structures 510. The active area of device 701 includes an NMOS formed in the P-well region (P-type layer/region) 518, and a PMOS formed in the N-well region 710.

Figure 7B:
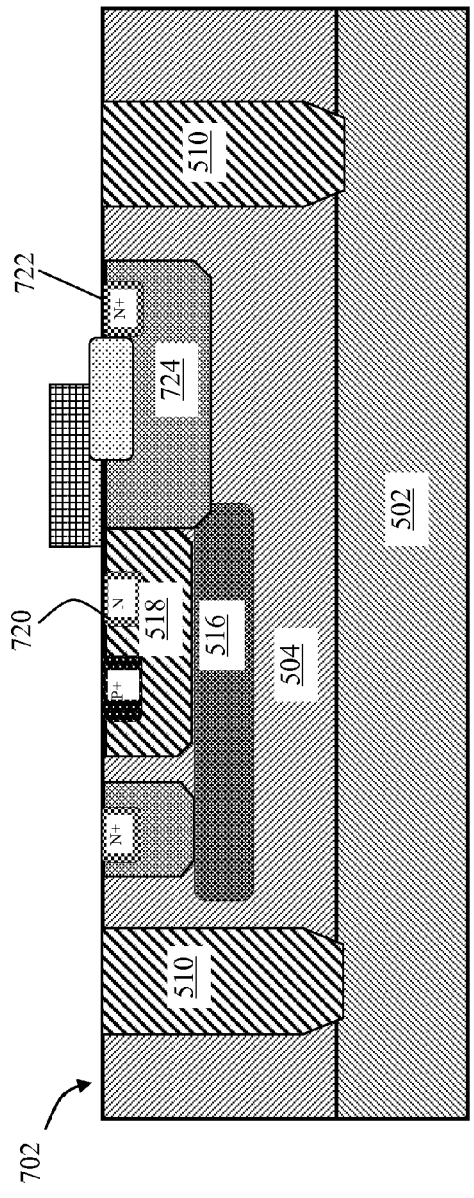

FIG. 7B shows an alternative embodiment in which the active area of device 702 is configured as an N-channel LDMOS that includes an N+source region 720 disposed in P-well region 518 and an N+ drain contact pickup region 722 disposed in N-well 724.

Figure 7C:
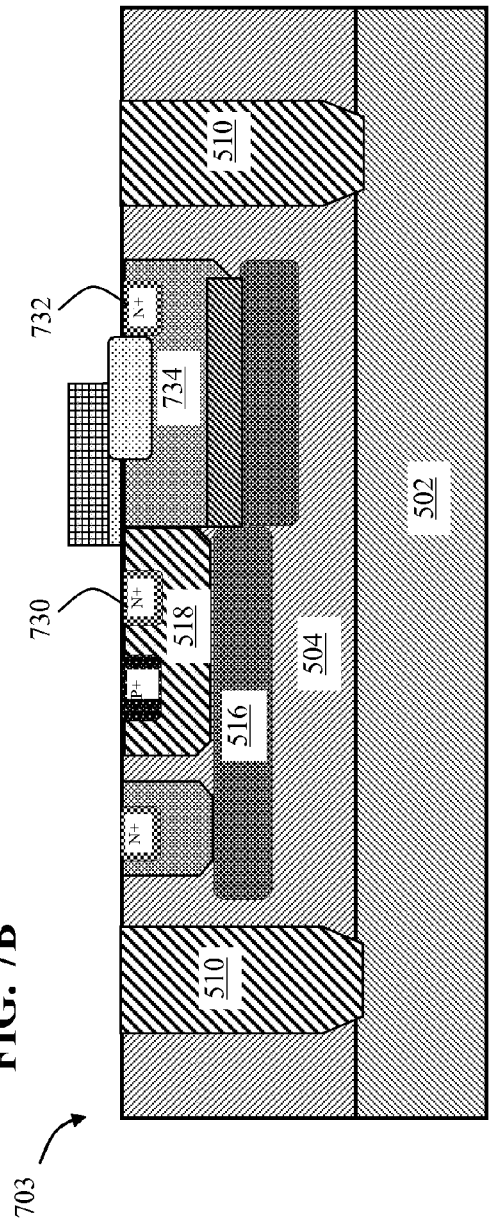

FIG. 7C shows an alternative embodiment of a double resurf NLDMOS device 703 formed in the N-type tub 504 between the two P-type isolation structures 510. The active area of device 703 includes an N+ source region 730 disposed in the P-well region 518 and an N+drain contact pickup region 732 disposed in N-well region 734. The double resurf NLDMOS device 703 provides low resistance between the source and the drain during the on state ($R_{ds-on}$) with superjunction, but in a lateral device.

Figure 7D:
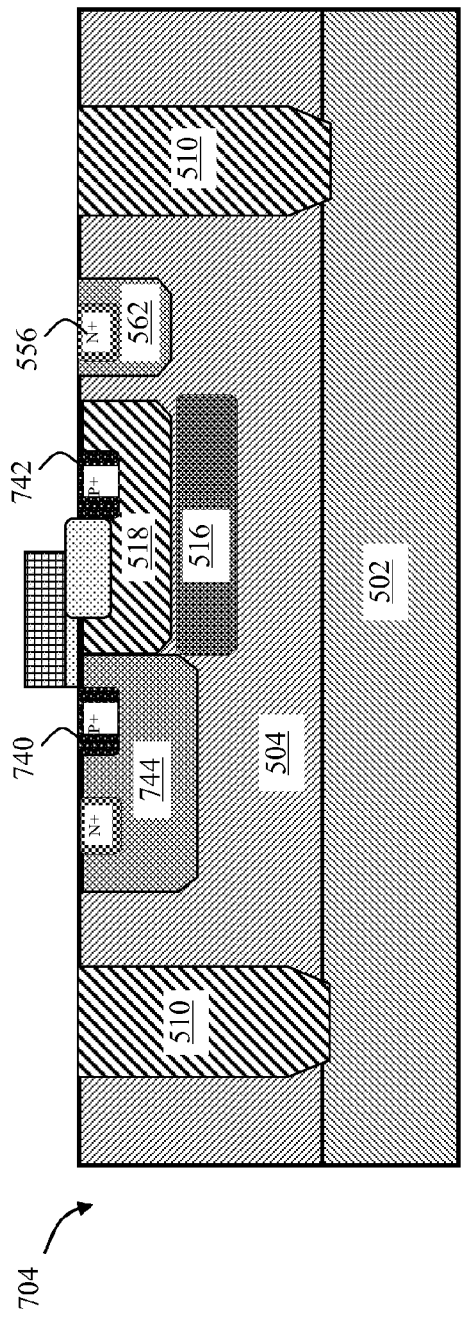

FIG. 7D shows an alternative embodiment of a P-channel LDMOS device 704 formed in the N-type tub 504 between the two P-type isolation structures 510. A P-channel LDMOS 704 can be formed in a same way as shown in FIG. 4B, except that the P+ source region 740 is now disposed in N-well region 744 provided as the body and P+ drain contact pickup 742 is now disposed in P-well region 518 provided as the drain.

Figure 7E:
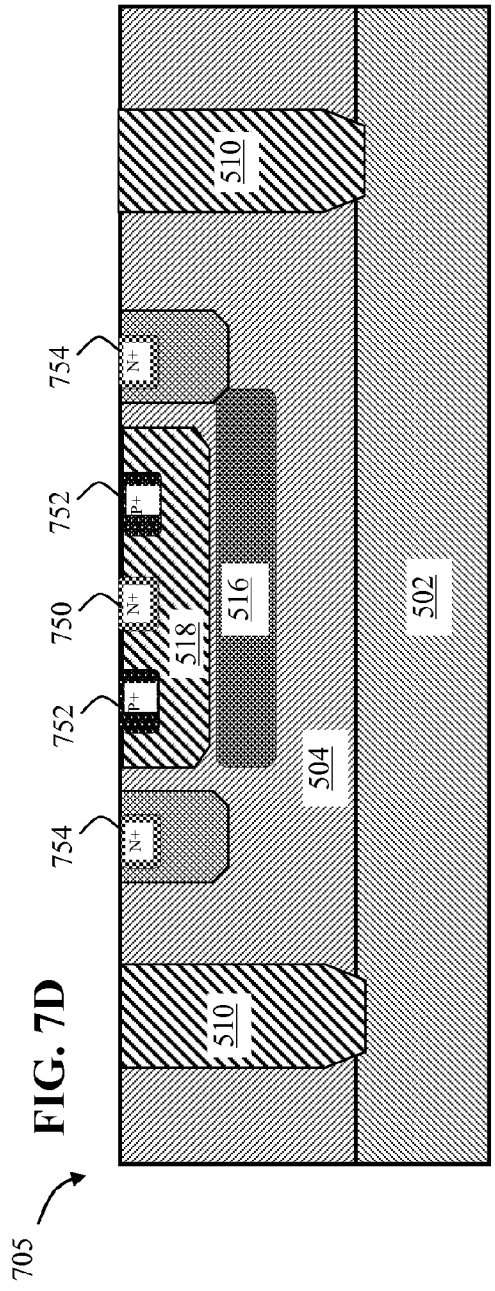

FIG. 7E shows an alternative embodiment of a high voltage vertical NPN transistor (VNPN) 705 formed between the two p-type isolation structures 510. The active area of device 705 includes a highly doped N+ region 750 disposed in the high voltage P-well region (HVPW) 518. The highly doped N+ region 750, the P-well region 518 and the N-type regions 516 and 504 below the P-well 518 configures a vertical NPN with N+ region 750 provided as the emitter, P-well 518 provided as the base and the N-type regions below the HVPW 518 provided as the collector. The P+ regions 752 disposed in HVPW5 provide contact pickups to the base while the N-type regions 754 disposed in top portion of the N-type tub 504 outside of the HVPW 518 provide contact pickups to the collector.

FIG. 7F shows an alternative embodiment in which the active area of device 706 is configured as a lateral PNP (LPNP) including a P region 760 provided as the emitter, a P ring 462 provided as the collector encircling the central P emitter region 760, and a N ring 764 provided as base contact pickup encircling the collector P ring 762 and the emitter P region 760.

FIG. 7G shows an alternative embodiment of an N-type junction gate field-effect transistor (NJFET) 707 formed between the two p-type isolation structures 510. The active area of the device 707 includes a highly doped P+ region 770 disposed in P-well region 518 provided as the gate. The gate contacts the N region 516 forming a PN junction.

Third Embodiment

Figure 8C:
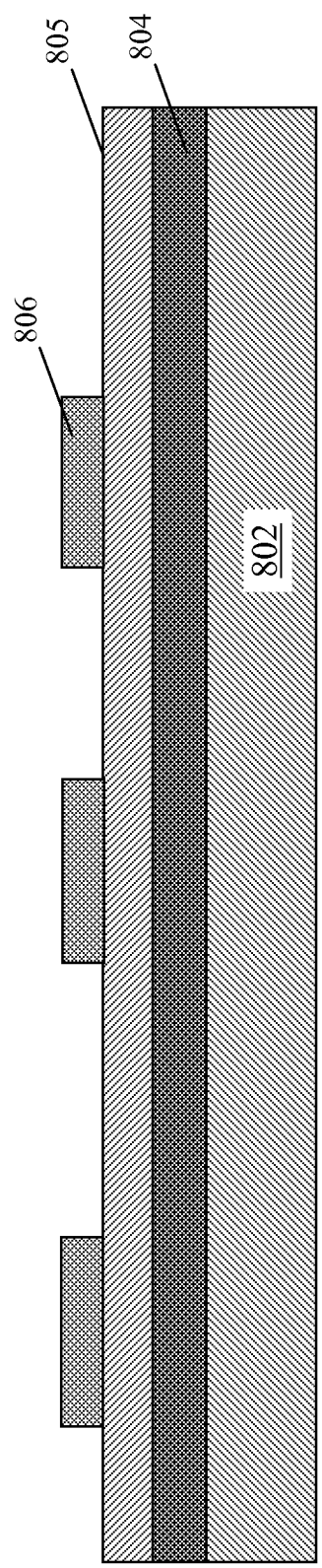

FIGS. 8A-8F are a sequence of cross-sectional schematic diagrams illustrating a method of fabrication of the device according to one embodiment of the present disclosure. In FIG. 8A, the process uses a P-type semiconductor substrate 802 as a starting material. The substrate 802 may be divided into multiple regions for forming devices of different operating voltage ratings. Each region is isolated by isolation structures as discussed below. For the sake of example, figures show a semiconductor device formed between two isolation structures. This is done to illustrate the general fabrication process and is not meant as a limitation on any embodiment of the invention. It is understood that the semiconductor device can be a bipolar transistor, a CMOS device or a DMOS device. It is further understood that any device combination can be integrated together in one single chip using the techniques disclosed in the disclosure below.

Next, instead of performing a blanket implantation, an N-type epitaxial structure is formed on the P-type substrate 802 by epitaxial deposition. The N-type epitaxial structure may include two or three N-type epitaxial layers. In the example where the N-type epitaxial structure includes two layers as shown in FIG. 8B, the bottom layer 804 is a more heavily doped layer with a doping concentration ranging from about $1 \times 10^{16}$ cm$^{-3}$ to about $1 \times 10^{17}$ cm$^{-3}$, and a top layer 805 is a less heavily doped layer with a doping concentration about $1 \times 10^{15}$ cm$^{-3}$. The bottom layer 804 is in a thickness of about 0.5 μm and the top layer 806 is about 1-2 μm thick. In the example of three-layer structure as shown in FIG. 8B-1, the more heavily doped layer is sandwiched between the two less heavily doped layers 803 and 805. For illustration, FIGS. 8C-8F only show cross-sectional schematic diagrams illustrating fabrication of a device with a two-layer N-epi structure.

After growing a screen oxide on the N-type epitaxial structure, a layer 806 of silicon nitride (SiN) can be deposited on the top. The thickness of the SiN layer 806 may be about 1000 Å to about 2000 Å. A photoresist (not shown) is formed on the layer 806 and patterned as an active area mask. Portions of the layer 806 exposed to an etchant through openings in the photoresist are etched away to form the SiN pattern 806 as shown in FIG. 8C.

Figure 8D:
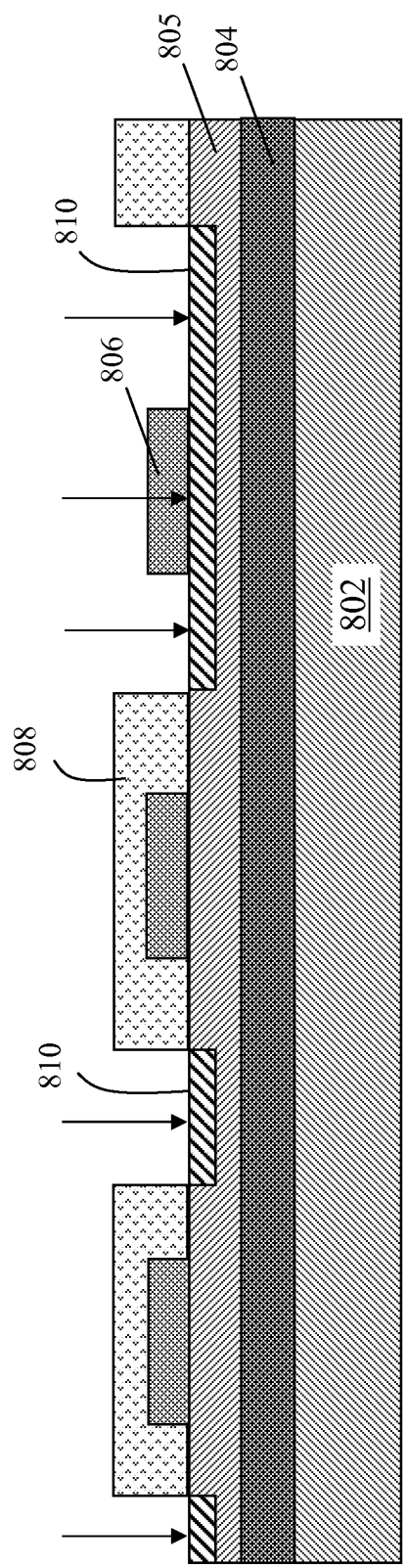

An isolation mask 808 is formed to define the isolation regions. That is, the isolation mask 808 covers the regions that are not to receive the boron implant for isolation structures. As shown in FIG. 8D, the isolation mask 808 is aligned to the SiN pattern 806 formed by the active area mask. As such, a zero mask for alignment can be omitted. A boron implant is then carried out to form P-type isolation layers 810.

In FIG. 8E, a thermal field oxidation cycle is performed to grow field oxide 812 and also drives in both Phosphorous and Boron to form an N-type tub 804 and P-type isolation regions 810 respectively. That is, the N-type tub 804 and P-type isolation regions 810 can be formed by only one masking step using the isolation mask 808. It is noted that if shallow trench isolation (STI) is used, liner oxidation cycle will work as the drive-in.

In FIG. 8F, with a photo mask 814, a P-type implant medium energy can be carried out to form a P-type layer 818 in the N-type epi layer 805. It is noted that an N-type implant is unnecessary in this embodiment. The highly doped N-type epitaxial layer 804 under the P-type layer 818 stops punch through between the P-type layer and the P-type substrate 802. Thus, a DNW masking step can be omitted. Optimization of thickness and doping concentration of the N-epi structure is very important in this embodiment.

Figure 9:
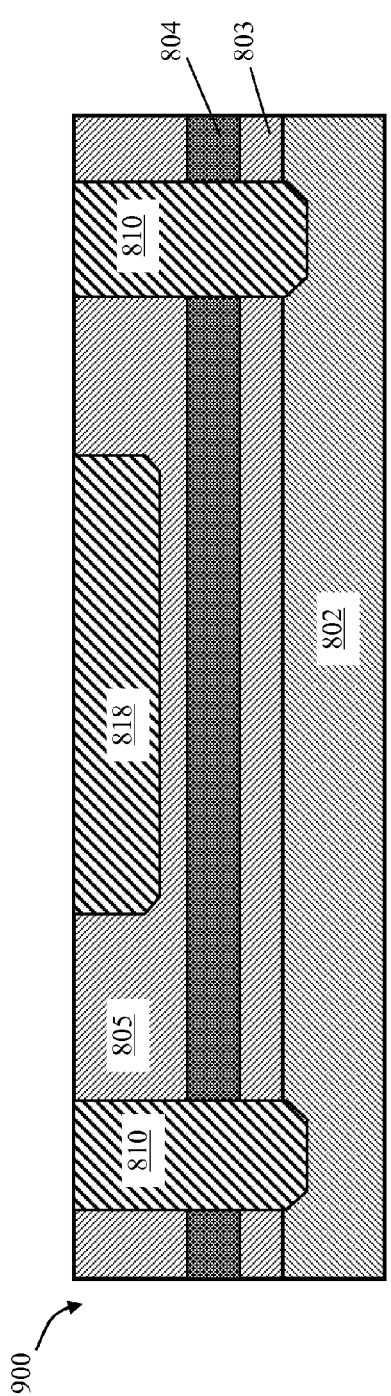
FIG. 9 is a cross-section schematic diagram illustrating a device with isolation structures and a punch through stopper according to the example of FIGS. 8A-8F.

FIG. 9 is a cross-section schematic diagram illustrating a device 900 with isolation structures and a punch through stopper according to the above embodiment of the present disclosure. Specifically, a device 900 has a three-layer N-epi structure. The heavily doped N-epi layer 804 is sandwiched between the less heavily doped layers 803 and 805.

A device may be formed in the N-epi layer 805 above the N-epi layer 804 and between two adjacent P-type isolation structures 810. The N-epi layer 804 acts as a punch through stopper stops punch through between the P-type layer/region 818 and the P-type substrate 802. It is understood that the device can be a bipolar transistor, a CMOS or a DMOS device.

Although an epitaxial step is used, the method described with respect to the third embodiment can still save cost by avoiding the need for a zero mask and reducing masking steps and avoiding long duration high temperature diffusion steps in forming the P-type isolation structures 810, N-buried layer punch through stopper 816 and the P-buried layer 818.

FIGS. 10A-10E shows examples of various devices implemented according to the embodiments of the present disclosure. These devices are well known to one of ordinary skill in the art and thus descriptions of functions and fabrication processes for these devices will be omitted.

Figure 10A:
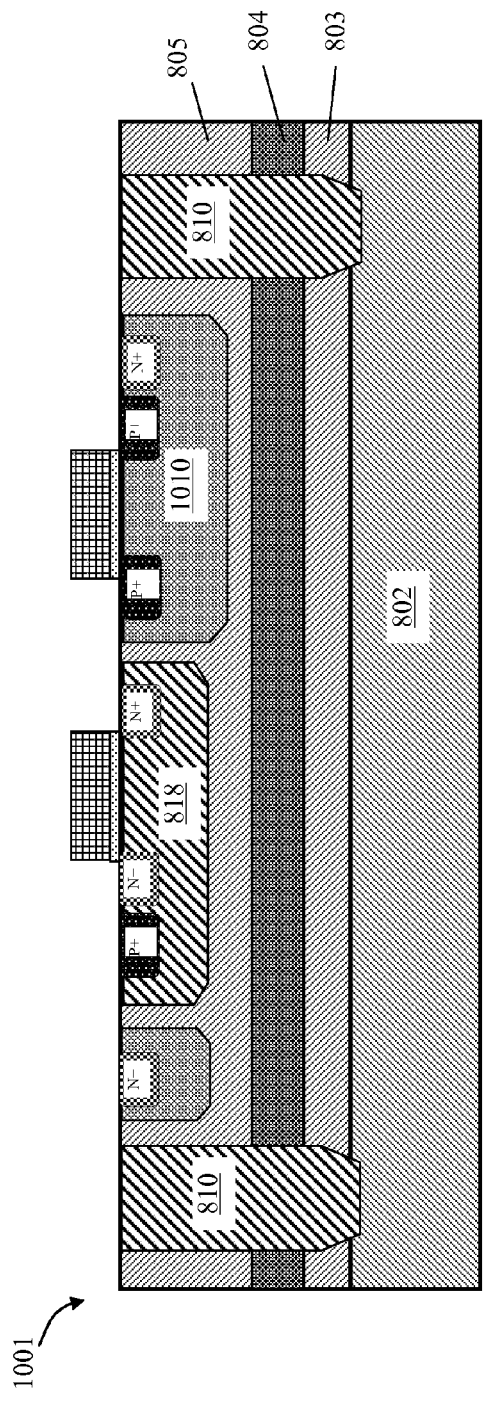

FIG. 10A shows a low voltage CMOS device 1001 formed in the N-epi layer 805 between the two P-type isolation structures 810. The active area of device 1001 includes an NMOS formed in the P-well region (P-type layer/region) 818, and a PMOS formed in the N-well region 1010.

FIG. 10B shows an alternative embodiment in which active area of device 1002 is configured as an N-channel LDMOS that includes an N+ source region 1020 disposed in P-well region 818 and an N+ drain contact pickup region 1022 disposed in N-well 1024.

FIG. 10C shows an alternative embodiment of a double resurf NLDMOS device 1003 formed in the N-epi layer 805 between the two P-type isolation structures 810. The active area of device 1003 includes an N+ source region 1030 disposed in the P-well region 818 and an N+ drain contact pickup region 1032 disposed in N-well region 1034. The double desurf NLDMOS device 1003 provides low resistance between the source and the drain during the on state ($R_{ds-on}$) with superjunction, but in a lateral device.

FIG. 10D shows an alternative embodiment of a P-channel LDMOS device 1004 formed in the N-epi layer 805 between the two P-type isolation structures 810. A P-channel LDMOS 1004 can be formed in a same way as shown in FIG. 4B, except that the P+ source region 1040 is now disposed in N-well region 1044 provided as the body and P+ drain contact pickup 1042 is now disposed in P-well region 818 provided as the drain.

FIG. 10E shows an alternative embodiment of a high voltage vertical NPN transistor (VNPN) 1005 formed between the two p-type isolation structures 810. The active area of device 1005 includes a highly doped N+ region 1050 disposed in the high voltage P-well region (HVPW) 818. The highly doped N+ region 1050, the P-well region 818 and the N epi layers 805, 804 and 803 below the P-well 818 configures a vertical NPN with N+ region 1050 provided as the emitter, P-well 818 provided as the base and the N epi layers below the HVPW 818 provided as the collector. The P+ regions 1052 disposed in HVPW provide contact pickups to the base while the N regions 1054 disposed in top portion of the N-type layer 805 outside of the HVPW 818 provide contact pickups to the collector. In addition, the active area of the device according to the third embodiment may be configured as a later PNP similar to the active area shown in FIG. 7F or an N-type junction gate field-effect transistor (NJFET) similar to the active area shown in FIG. 7G.

Aspects of the present disclosure enable integration of bipolar, CMOS, and DMOS devices into a single wafer. This facilitates fabrication of compact devices having, e.g., CMOS elements that implement logic functions, Bipolar elements to implement analog devices, and DMOS elements to implement high voltage devices.

While the above is a complete description of the preferred embodiments of the present invention, it is possible to use various alternatives, modifications, and equivalents. Although certain process steps appear in a certain order in the claims, the steps are not required to be carried out in order in which unless a particular order is specified. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC §112(f).

What is claimed is:

1. A method, comprising:
   a) forming an unpatterned first layer of a second conductivity type above a semiconductor substrate of a first conductivity type;
   b) forming one or more isolation structures of the first conductivity type, wherein the one or more isolation structures extend in depth through the first layer of the second conductivity type and to the semiconductor substrate of the first conductivity type;
   c) forming a region of the first conductivity type with a first well mask in a portion of the first layer that is isolated by the one or more isolation structures, and after forming the region of the first conductivity type, increasing a size of openings of the first well mask; and then
   d) forming a punch-through stopper of the second conductivity type under the region of the first conductivity type that is isolated by the one or more isolation structures, wherein the punch-through stopper of the second conductivity type is heavily doped compared to the first layer of the second conductivity type.

2. The method of claim 1, wherein the first conductivity type is P and the second conductivity type is N.

3. The method of claim 1, wherein the first layer of the second conductivity type has a doping concentration of about $1 \times 10^{15}$ cm$^{-3}$.

4. The method of claim 1, wherein the punch-through stopper of the second conductivity type has a doping concentration ranging from about $1 \times 10^{16}$ cm$^{-3}$ to about $1 \times 10^{17}$ cm−3.

5. The method of claim 1, wherein the plurality of the isolation structures are formed by ion implantation with an isolation mask followed by a drive-in diffusion process, wherein the isolation mask is aligned with a plurality of active area patterns formed by an active area mask.

6. The method of claim 5, wherein the drive-in diffusion process drives in both ions in the first layer of the second conductivity type and in the isolation structures of the first conductivity type.

7. The method of claim 1, wherein the region of the first conductivity type is formed by performing a medium energy ion implant with a first well mask and the punch-through stopper of the second conductivity type is formed by a high energy ion implant with the first well mask or a second well mask different from the first well mask, wherein the region of the first conductivity type has a width between the two adjacent isolation structures that is equal to or less than that of the punch-through stopper of the second conductivity type.

8. The method of claim 1, wherein the unpatterned first layer of the second conductivity type is formed by blanket implantation.

9. The method of claim 1, wherein the unpatterned first layer of the second conductivity type and the punch-through stopper of the second conductivity type are epitaxial layers formed by deposition, wherein the first layer of the second conductivity type is provided above the punch-through stopper of the second conductivity type.

10. The method of claim 9, further comprising forming a second layer of the second conductivity type under the punch-through stopper of the second conductivity type and above the semiconductor substrate, wherein the second layer of the second conductivity type is an epitaxial layer with a doping concentration similar to that of the first layer of the second conductivity type.

11. The method of claim 9, wherein the punch-through stopper of the second conductivity type is of a thickness that is less than that of the first layer of the second conductivity type.

* * * * *